US009406714B2

United States Patent
Jung et al.

(10) Patent No.: US 9,406,714 B2
(45) Date of Patent: Aug. 2, 2016

(54) UNIT PIXEL WITH PHOTODIODE UNDER GATE OF SENSING TRANSISTOR AND IMAGE PIXEL ARRAY INCLUDING THE SAME

(71) Applicant: SAMSUNG ELECTRONICS CO., LTD., Suwon-si, Gyeonggi-do (KR)

(72) Inventors: Ju-Hwan Jung, Seoul (KR); Young-Gu Jin, Osan-si (KR); Hiroshige Goto, Suwon-si (KR); Hee-Woo Park, Seoul (KR); Jung-Hyung Pyo, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/535,583

(22) Filed: Nov. 7, 2014

(65) Prior Publication Data
US 2015/0200224 A1 Jul. 16, 2015

(30) Foreign Application Priority Data

Jan. 14, 2014 (KR) .................. 10-2014-0004302

(51) Int. Cl.
*H01L 27/146* (2006.01)
(52) U.S. Cl.
CPC .... *H01L 27/14643* (2013.01); *H01L 27/14603* (2013.01); *H01L 27/14616* (2013.01)
(58) Field of Classification Search
CPC ............ H01L 27/14603; H01L 17/14643; H01L 27/14609; H01L 27/14612; H01L 27/14614; H01L 27/14605
USPC ........................................................ 257/292
See application file for complete search history.

(56) References Cited

U.S. PATENT DOCUMENTS

| 7,777,168 | B2 | 8/2010 | Tournier et al. | |
| 7,940,319 | B2 | 5/2011 | Hynecek | |
| 8,242,546 | B2 | 8/2012 | Hynecek | |
| 8,350,939 | B2 | 1/2013 | Yin et al. | |
| 2002/0171097 | A1* | 11/2002 | Chen | H01L 31/112 257/292 |
| 2008/0151091 | A1* | 6/2008 | Hynecek | H04N 5/335 348/308 |
| 2012/0092536 | A1 | 4/2012 | Hirota | |
| 2013/0113066 | A1* | 5/2013 | Grenouillet | H01L 27/146 257/458 |
| 2014/0103413 | A1* | 4/2014 | Jin | H01L 27/1461 257/292 |
| 2015/0221696 | A1* | 8/2015 | Lee | H01L 27/14643 257/292 |

FOREIGN PATENT DOCUMENTS

| JP | 2003-298036 | 10/2003 |
| JP | 2011-199050 | 10/2011 |
| KR | 10-2001-0012048 A | 2/2001 |
| KR | 10-2003-0065863 A | 8/2003 |
| KR | 10-2006-0110147 A | 10/2006 |

* cited by examiner

*Primary Examiner* — Peter Bradford
(74) *Attorney, Agent, or Firm* — Lee & Morse, P.C.

(57) ABSTRACT

A unit pixel includes a sensing transistor, a photo diode, and a reset drain region. The sensing transistor includes a reference active region, an output active region, and a gate. The gate is between the reference active region and the output active region to electrically connect the reference active region to the output active region based on a gate voltage. The reference active region and output active region are within a semiconductor substrate. The photo diode is under the gate within the semiconductor substrate. The reset drain region is within the semiconductor substrate and is electrically connected to the photo diode by the gate based on the gate voltage.

19 Claims, 18 Drawing Sheets

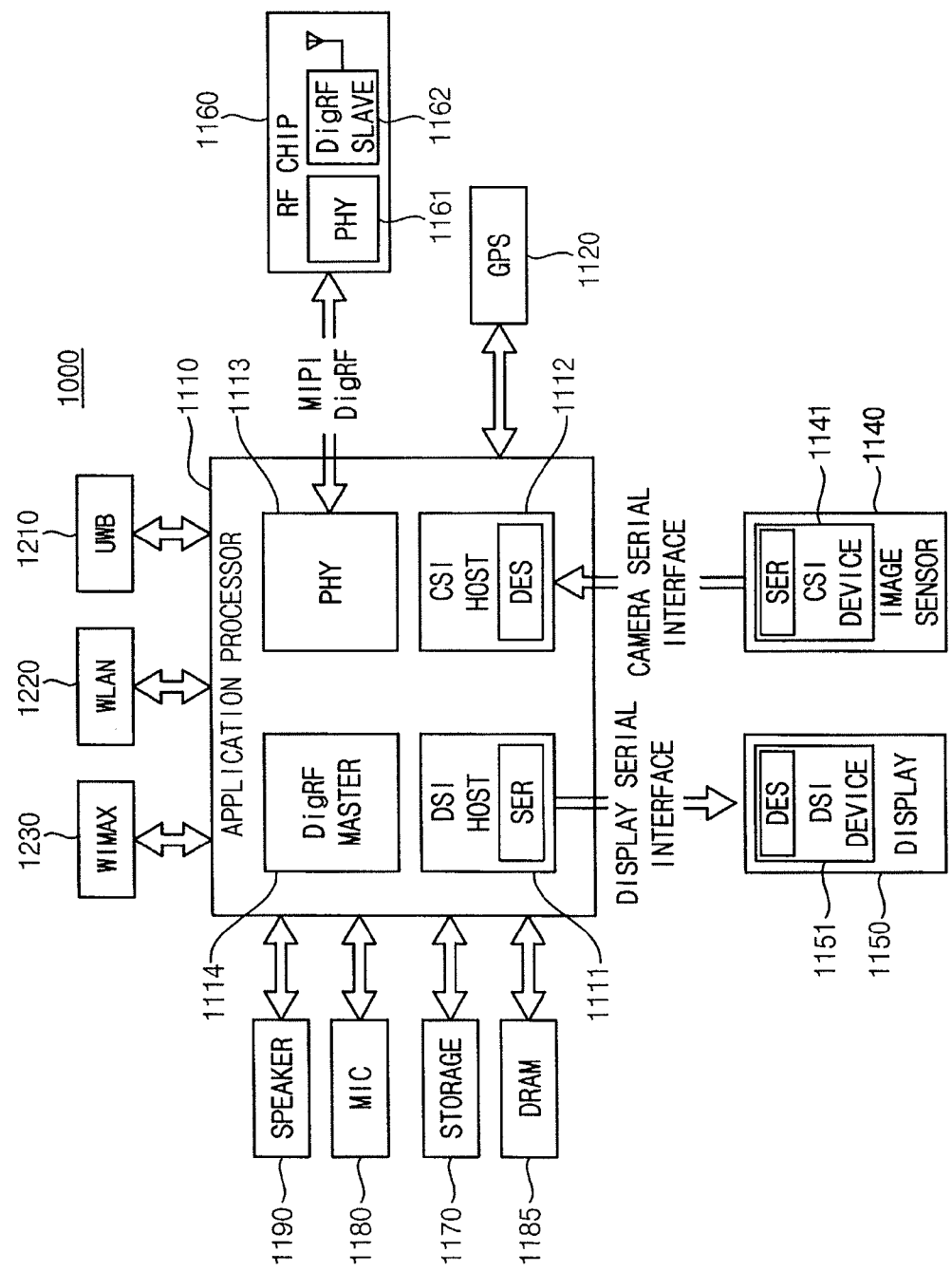

UNIT PIXEL WITH PHOTODIODE UNDER GATE OF SENSING TRANSISTOR AND IMAGE PIXEL ARRAY INCLUDING THE SAME

CROSS-REFERENCE TO RELATED APPLICATION

Korean Patent Application No. 10-2014-0004302, filed on Jan. 14, 2014, and entitled, "Unit Pixel and Image Pixel Array Including the Same," is incorporated by reference herein in its entirety.

BACKGROUND

1. Field

One or more embodiments described herein relate to a unit pixel and an image pixel array including one or more unit pixel.

2. Description of the Related Art

An image sensor converts optical signals including image and/or distance (e.g., depth) information into electrical signals. As portable and other electronic devices evolve, the demand for smaller size image sensors with high resolution increases.

SUMMARY

In accordance with one embodiment, a unit pixel includes a sensing transistor including a reference active region, an output active region, and a gate, the gate located between the reference active region and the output active region on a semiconductor substrate to electrically connect the reference active region to the output active region based on a gate voltage, the reference active region and the output active region within the semiconductor substrate; a photo diode under the gate within the semiconductor substrate; and a reset drain region within the semiconductor substrate to be electrically connected to the photo diode by the gate based on the gate voltage.

The gate may be on the semiconductor substrate to cover part or all of a read channel region and a reset channel region, the read channel region may be between the reference active region and the output active region, and the reset channel region may be between the photo diode and reset drain region.

The reference active region may be electrically connected to the output active region when the gate voltage is at a first voltage level, the reference region electrically may be connected to the output active region by a read channel on the semiconductor substrate of the read channel region, and the photo diode may be electrically connected to the reset drain region when the gate voltage is at a second voltage level opposite in sign to the first voltage level, the photo diode electrically connected to the reset drain region by a reset channel on the semiconductor substrate of the reset channel region.

The reference active region may not be electrically connected to the output active region when the gate voltage is a ground voltage level, the reference active region may not be electrically connected to the output active region as a result of the read channel being deactivated, and the photo diode may not be electrically connected to the reset drain region when the reset channel is deactivated.

The reference active region and the output active region may be respectively on a first side and a second side of the photo diode according to a first direction, and the reset drain region may be on a third side of the photo diode according to a second direction different from the first direction.

The reference active region and the output active region may be doped with a P-type dopant, and the photo diode and the reset drain region may be doped with an N-type dopant. The gate voltage may be at a positive voltage level during a reset mode, and the photo diode may be initialized by a reset voltage applied to the reset drain region.

The gate voltage may be a ground voltage level, or a negative voltage level between the ground voltage level and a read voltage, during an integration mode, and the photo diode may convert incident light to a photo-charge.

The gate voltage may be a negative voltage level during a read mode, and a sensing current may be transferred between the reference active region based on the reference voltage and the output active region, connected to an output line, by turning-on the sensing transistor. The sensing current may be increased as a quantity of photo-charge in the photo diode is increased. A negative reference voltage may be applied to the reference active region, and a positive reset voltage may be applied to the reset drain region.

The reference active region and the output active region may be doped with an N-type dopant, and the photo diode and the reset drain region may be doped with a P-type dopant. The gate voltage may be a negative voltage level during a reset mode, the photo diode may be initialized by a reset voltage applied to the reset drain region, the gate voltage may be a positive voltage level during a read mode, and a sensing current may be transferred between the reference active region applied by the reference voltage and the output active region, connected to an output line, by turning-on the sensing transistor.

In accordance with another embodiment, an image pixel array includes a plurality of unit pixels connected to a plurality of gate voltage lines, a plurality of reference voltage lines, a plurality of reset voltage lines, and a plurality of output lines, each unit pixel of the plurality of the unit pixels including: a sensing transistor including a gate, a reference active region receiving a reference voltage, and an output active region providing a output signal, the gate located between the reference active region and the output active region on a semiconductor substrate to electrically connect the reference active region to the output active region based on a gate voltage, the reference active region and the output active region within the semiconductor substrate; a photo diode under the gate within the semiconductor substrate; and a reset drain region within the semiconductor substrate to be electrically connected to the photo diode by the gate based on the gate voltage.

Two unit pixels of the plurality of unit pixels may be in respective adjacent rows and share the reset drain region, the two unit pixels symmetrically placed based on a boundary line extending in a row direction. The two unit pixels may share the reference active region and being symmetrically placed based on a boundary line in a column direction.

The gate may be on the semiconductor substrate to cover the output active region with a ring shape or a square shape, and the reset drain region and the reference active region may be shared by the plurality of the unit pixels. A channel between the reference active region and the output active region may be a recess channel.

In accordance with another embodiment, a pixel includes a sensing transistor including a gate, a reference active region, and an output active region, the gate to form a channel between the reference active region and the output active region based on a gate voltage; a photo diode under the channel; and a reset drain region electrically connected to the photo diode, wherein the reference active region, the output active region, and the gate are within a substrate. The reset drain region may be electrically connected to the photo diode by the gate based on the gate voltage. The reference active region, the output active region, and the reset drain region may be substantially coplanar.

BRIEF DESCRIPTION OF THE DRAWINGS

Features will become apparent to those of skill in the art by describing in detail exemplary embodiments with reference to the attached drawings in which:

FIG. 28 illustrates an example of an interface for the computing system.

DETAILED DESCRIPTION

Figure 1:
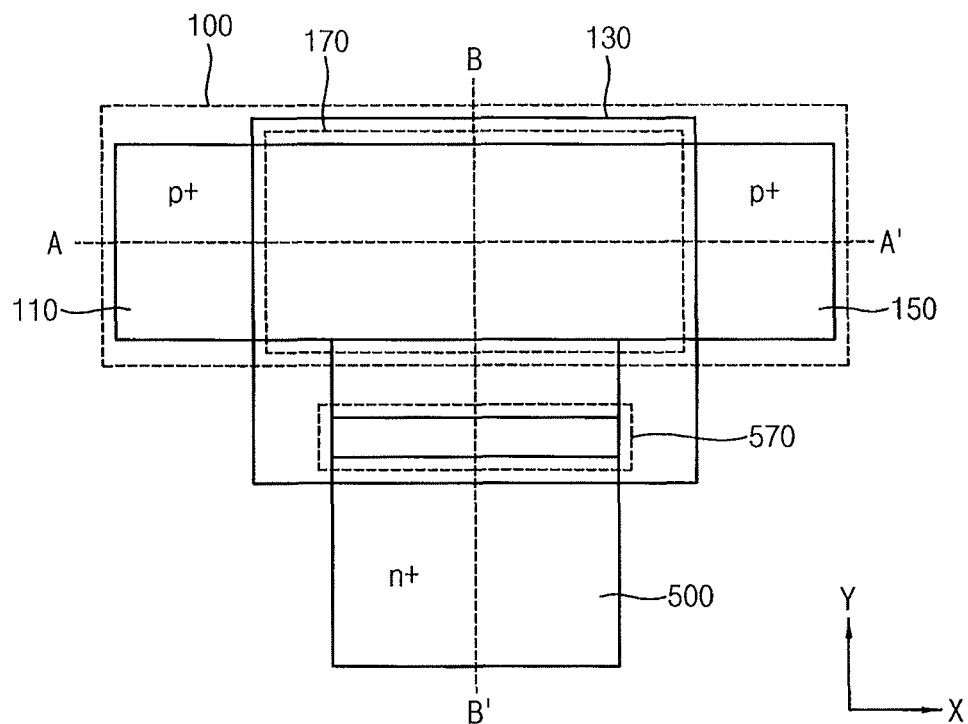
FIG. 1 illustrates an embodiment of a unit pixel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 2:
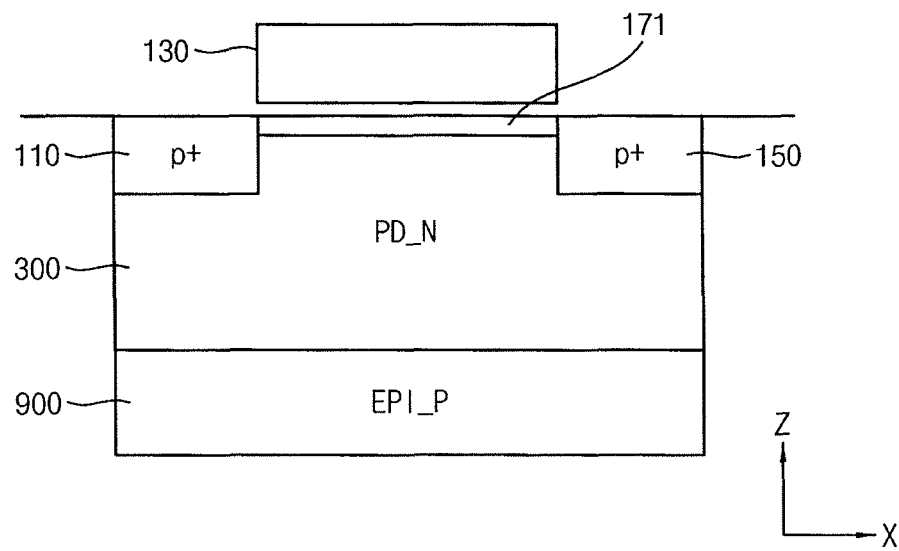
FIG. 2 illustrates a view taken along section line A-A' in FIG. 1.
Figure 3:
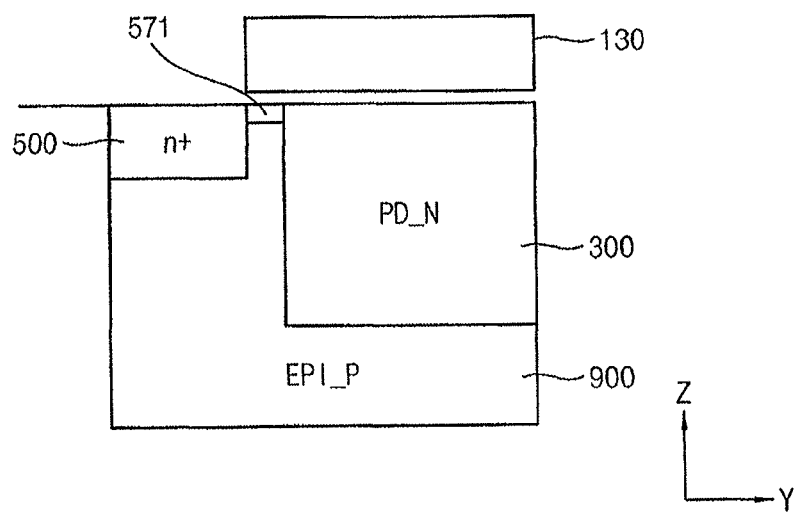
FIG. 3 illustrates a view taken along section line B-B' in FIG. 1.

FIG. 1 illustrates an embodiment of a unit pixel 10*a*, FIG. 2 illustrates a cross-sectional view of the unit pixel taken along line A-A', and FIG. 3 illustrates a cross-sectional diagram of the unit pixel taken along line B-B'.

Referring to FIGS. 1 and 2, the unit pixel 10*a* includes a sensing transistor 100, a photo diode 300, a reset drain region 500, and an epitaxial region 900. The sensing transistor 100 includes a reference active region 110, an output active region 150, and a gate 130. The gate 130 is formed between the reference active region 110 and the output active region 150 on a semiconductor substrate. The gate electrically connects the reference active region 110 to the output active region 150 in response to a gate voltage VG. The reference active region 110 and the output active region 150 may be formed inside the semiconductor substrate in one embodiment.

The reference active region 110 and the output active region 150 may be doped with a P-type dopant or an N-type dopant. For example, in case the reference active region 110 is doped with the P-type dopant, the output active region 150 may be doped with the P-type dopant. In case the reference active region 110 is doped with the N-type dopant, the output active region 150 may be doped with the N-type dopant.

The gate may include, for example, a transparent conducting oxide or a non-transparent conducting oxide. When light incident on the unit pixel 10*a* passes through an upper surface of a semiconductor substrate, the gate may be formed with a transparent conducting oxide. When light incident on the unit pixel 10*a* passes through a lower surface of the semiconductor substrate, the gate may be formed with a non-transparent conducting oxide.

As will be described referring to FIG. 4, the reference active region 110 formed in the semiconductor substrate may be connected to a reference voltage line VRL to receive the reference voltage VR. The output active region 150 may be connected to an output voltage line VOL to transfer an output voltage VO. The gate may be connected to a gate voltage line VGL to receive the gate voltage VG. For example, when the sensing transistor 100 is turned-on in response to the gate voltage VG, the reference active region 110 and the output active region 150 may be electrically connected through a read channel 171 in a read channel region 170. When the read channel 171 is formed, a sensing current IS is transferred through the read channel 171 between the reference active region 110 and the output active region 150.

The photo diode 300 is formed under the gate within the semiconductor substrate. The photo diode 300 may be doped with a P-type dopant or an N-type dopant. For example, if the photo diode 300 is doped with the P-type dopant, holes move into an upper region of the photo diode 300 when the unit pixel 10a is operating in an integration mode. If the photo diode 300 is doped with the N-type dopant, electrons move into the upper region of the photo diode 300 when the unit pixel 10a is operating in the integration mode.

Referring to FIGS. 1 and 3, the reset drain region 500 is formed within the semiconductor substrate and is electrically connected to the photo diode 300 by the gate in response to the gate voltage VG. The reset drain region 500 may be doped with a P-type dopant or an N-type dopant. For example, in case the photo diode 300 is doped with the P-type dopant, the reset drain region 500 may be doped with the P-type dopant. In case the photo diode 300 is doped with the N-type dopant, the reset drain region 500 may be doped with the N-type dopant.

The reset drain region 500 formed in the semiconductor substrate may be connected to a reset voltage line VRSTL and receive a reset voltage VRST. When a reset channel 571 in a reset channel region 570 is formed in response to the gate voltage VG, a photo-charge is transferred from the photo diode 300 to the reset drain region 500 through the reset channel 571 between the photo diode 300 and the reset drain region 500.

For example, when the reset drain region 500 and the photo diode 300 are doped with the P-type dopant, the reset voltage VRST transferred to the reset drain region 500 is a negative voltage and the photo-charge transferred through the reset channel 571 is a hole. When the reset drain region 500 and the photo diode 300 are doped with the N-type dopant, the reset voltage VRST transferred to the reset drain region 500 may is positive voltage and the photo-charge transferred through the reset channel 571 is an electron.

The reference active region 110 and the output active region 150 in the sensing transistor 100 is electrically connected through the read channel 171 in the read channel region 170 in response to the gate voltage VG. When the read channel 171 is formed, the sensing current IS is transferred through the read channel 171 between the reference active region 110 and the output active region 150.

The reset drain region 500 and the photo diode 300 in the sensing transistor 100 is electrically connected through the reset channel 571 in the reset channel region 570 in response to the gate voltage VG. When the reset channel 571 is formed, the photo-charge is transferred from the photo diode 300 to the reset drain region 500 through the reset channel 571 between the photo diode 300 and the reset drain region 500. The unit pixel 10a may allow the size of an image sensor to be reduced by using fewer transistors than other arrangements, while simultaneously allowing for an increase in resolution of the image sensor.

Figure 4:
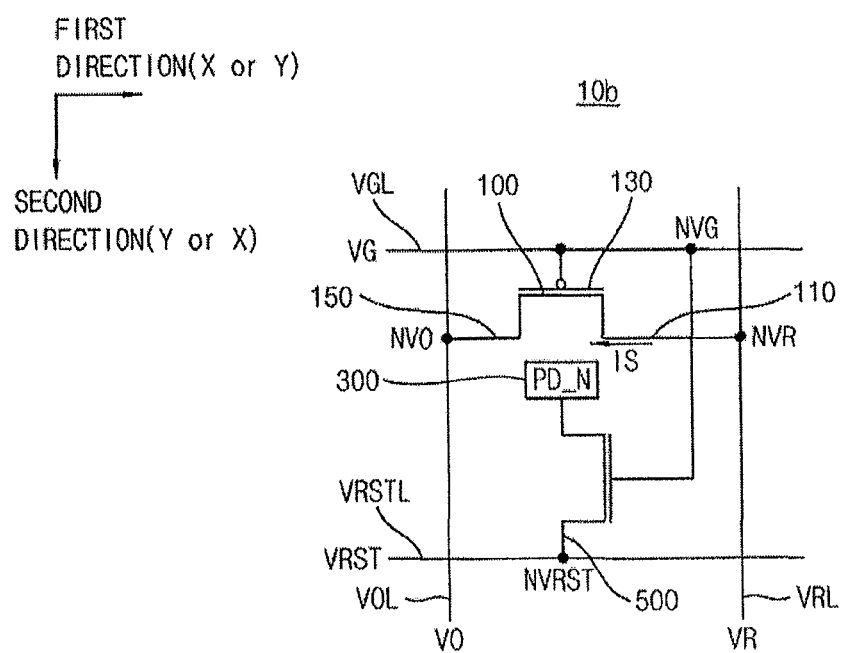
FIG. 4 illustrates an equivalent circuit of the unit pixel.

FIG. 4 illustrates an example of an equivalent circuit 10b of the unit pixel 10a in FIG. 1. Referring to FIGS. 1 and 4, the equivalent circuit 10b of the unit pixel 10a includes a sensing transistor 100, a photo diode 300, and a reset drain region 500. The sensing transistor 100 includes a reference active region 110, an output active region 150, and a gate.

The reference active region 110 may be connected to the reference voltage line VRL through a reference voltage node NVR. The reference voltage VR applied to the reference voltage line VRL may be transferred to the reference active region 110 through the reference voltage node NVR. The gate may be connected to the gate voltage line VGL through a gate voltage node NVG. The gate voltage VG applied to the gate voltage line VGL may be transferred to the gate through the gate voltage node NVG.

The reset drain region 500 may be connected to the reset voltage line VRSTL through a reset voltage node NVRST. The reset voltage VRST applied to the reset voltage line VRSTL may be transferred to the reset drain region 500 through the reset voltage node NVRST. The output active region 150 may be connected to the output voltage line VOL through an output voltage node NVO. The output voltage VO applied to the output voltage line VOL may be transferred to the output active region 150 through the output voltage node NVO.

In accordance with one embodiment, the unit pixel 10b operates in various modes including a reset mode, an integration mode, and a read mode. In the reset mode, the photo diode 300 may be initialized by a reset voltage VRST applied to the reset drain region 500. In the integration mode, the photo diode 300 may convert incident light to a photo-charge. In the read mode, a sensing current may be transferred between the reference active region 110 and the output active region 150 by turning-on the sensing transistor 100.

When the unit pixel 10b operates in the reset mode, the reset voltage VRST is applied to the reset drain region 500. When the reset voltage VRST is applied to the reset drain region 500, the reset channel 571 is formed between the photo diode 300 and the reset drain region 500 in response to the gate voltage VG. When the reset channel 571 is formed between the photo diode 300 and the reset drain region 500, the photo-charge is transferred from the photo diode 300 to the reset drain region 500 through the reset channel 571 between the photo diode 300 and the reset drain region 500.

When the unit pixel 10b operates in the integration mode, a ground voltage may be applied to the gate voltage line VGL. When the ground voltage is applied to the gate voltage line VGL, the read channel 171 is not formed in the read channel region 170 in the sensing transistor 100, and the reset channel 571 is not formed in the reset channel region 570 between the photo diode 300 and the reset drain region 500. In this case, the photo diode 300 converts incident light to a photo-charge.

When the unit pixel 10b is operating in the read mode, if the gate voltage VG is applied to the gate voltage line VGL, the sensing transistor 100 is turned-on in response to the gate voltage VG. When the sensing transistor 100 is turned-on, the reference active region 110 and the output active region 150 may be electrically connected through the read channel 171 in the read channel region 170. When the read channel 171 is formed, the sensing current IS is transferred through the read channel 171 between the reference active region 110 and the output active region 150.

In an example embodiment, the gate may be formed on the semiconductor substrate to cover a part or all of the read channel region 170 and the reset channel region 570. The read channel region 170 may be formed between the reference active region 110 and the output active region 150. The reset channel region 570 may be formed between the photo diode 300 and the reset drain region 500.

In one embodiment, when the gate voltage VG is at a first voltage level, the reference active region 110 is electrically connected to the output active region 150 by forming a read channel 171 on the semiconductor substrate of the read channel region 170. When the gate voltage VG is at a second voltage level that is opposite in sign to the first voltage level, the photo diode 300 is electrically connected to the reset drain region 500 by forming a reset channel 571 on the semiconductor substrate of the reset channel region 570. The read channel region 170 and the reset channel region 570 may be controlled using one gate. When the first voltage level is positive, the second voltage level is negative. When the first voltage level is negative, the second voltage level is positive.

For example, when the reference active region 110 and the output active region 150 are doped with the P-type dopant, the sensing transistor 100 is a PMOS sensing transistor 100. The reset drain is doped with the N-type dopant. In this case, if the gate voltage VG is negative, the sensing transistor 100 may be turned-on. When the sensing transistor 100 is turned-on, the read channel 171 may be formed in the read channel region 170.

If the gate voltage VG is negative, the reset channel 571 is not formed in reset channel region 570 between the photo diode 300 and the reset drain region 500. For example, if the gate voltage VG is positive, the sensing transistor 100 is turned-off. When the sensing transistor 100 is turned-off, the read channel 171 is not formed in the read channel region 170. If the gate voltage VG is positive, the reset channel 571 is formed in the reset channel region 570 between the photo diode 300 and the reset drain region 500.

Alternatively, if the reference active region 110 and the output active region 150 are doped with the N-type dopant, the sensing transistor 100 is an NMOS sensing transistor 100. The reset drain is doped with the P-type dopant. In this case, if the gate voltage VG is positive, the sensing transistor 100 is turned-on. When the sensing transistor 100 is turned-on, the read channel 171 is formed in the read channel region 170.

If the gate voltage VG is positive, the reset channel 571 is be formed in reset channel region 570 between the photo diode 300 and the reset drain region 500. For example, if the gate voltage VG is negative, the sensing transistor 100 is turned-off. When the sensing transistor 100 is turned-off, the read channel 171 is not formed in the read channel region 170. If the gate voltage VG is negative, the reset channel 571 is formed in reset channel region 570 between the photo diode 300 and the reset drain region 500. Therefore the read channel region 170 and the reset channel region 570 is controlled using the one gate.

In another embodiment, when the gate voltage VG is a ground voltage level, the reference active region 110 may not be electrically connected to the output active region 150 by deactivating the read channel 171, and the photo diode 300 is not electrically connected to the reset drain region 500 by deactivating the reset channel 571. If the gate voltage VG is the ground voltage, the sensing transistor 100 is turned-off. When the sensing transistor 100 is turned-off, the read channel 171 is not formed in the read channel region 170 and the reset channel 571 is not formed in reset channel region 570 between the photo diode 300 and the reset drain region 500. When the read channel 171 is not formed, the reference active region 110 may not be electrically connected to the output active region 150. When the reset channel 571 is not formed, the photo diode 300 is not electrically connected to the reset drain region 500.

The reference active region 110 and the output active region 150 may be formed, for example, on respective first and second sides of the photo diode 300 in a first direction. The reset drain region 500 may be formed on a third side of the photo diode 300 in a second direction that is different from (e.g., perpendicular to) the first direction.

For example, if the first direction is an X-axis, the second direction may be a Y-axis. Conversely, the first direction is the Y-axis and the second direction may be the X-axis. If the reference active region 110 is formed on the first side of the photo diode 300, the output active region 150 may be formed on the second side of the photo diode 300 and the reset drain region 500 may be formed on the third side of the photo diode 300. If the output active region 150 is formed on the first side of the photo diode 300, the reference active region 110 is formed on the second side of the photo diode 300 and the reset drain region 500 is formed on the third side of the photo diode 300.

The unit pixel 10b has a T shape. In other embodiments, the unit pixel 10b may have a ring shape, a polygon shape (e.g., a regular polygon shape), or another shape.

In one embodiment, the reference active region 110 and the output active region 150 may be doped with a P-type dopant. The photo diode 300 and the reset drain region 500 are doped with an N-type dopant. For example, if the reference active region 110 and the output active region 150 are doped with the P-type dopant, the sensing transistor 100 may be a PMOS sensing transistor 100. If the gate voltage VG is negative, the sensing transistor 100 is turned-on. When the sensing transistor 100 is turned-on, the read channel 171 may be formed in the read channel region 170. Also, if the gate voltage VG is negative, the reset channel 571 is not formed in the reset channel region 570 between the photo diode 300 and the reset drain region 500.

If the gate voltage VG is positive, the sensing transistor 100 is turned-off. When the sensing transistor 100 is turned-off, the read channel 171 is not formed in the read channel region 170. Also, if the gate voltage VG is positive, the reset channel 571 may be formed in the reset channel region 570 between the photo diode 300 and the reset drain region 500.

The reference active region 110 and the output active region 150 in the sensing transistor 100 is electrically connected through the read channel 171 in the read channel region 170 in response to the gate voltage VG. When the read channel 171 is formed, the sensing current IS is transferred through the read channel 171 between the reference active region 110 and the output active region 150.

The reset drain region 500 and the photo diode 300 are electrically connected through the reset channel 571 in the reset channel region 570 in response to the gate voltage VG. When the reset channel 571 is formed, the photo-charge is transferred from the photo diode 300 to the reset drain region 500 through the reset channel 571 between the photo diode 300 and the reset drain region 500.

Figure 5:
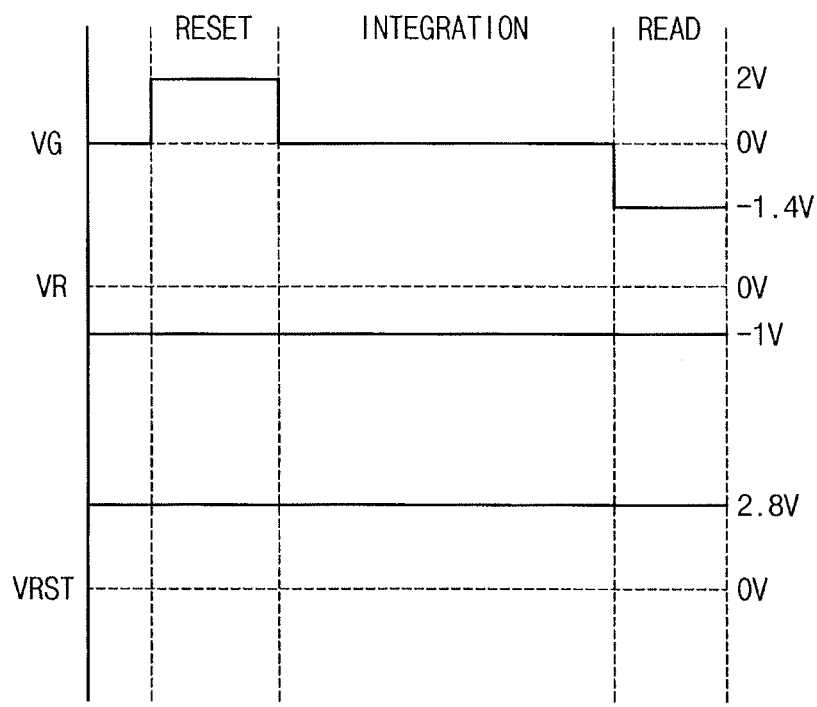
FIG. 5 illustrates operation of the unit pixel according to one embodiment.
Figure 6:
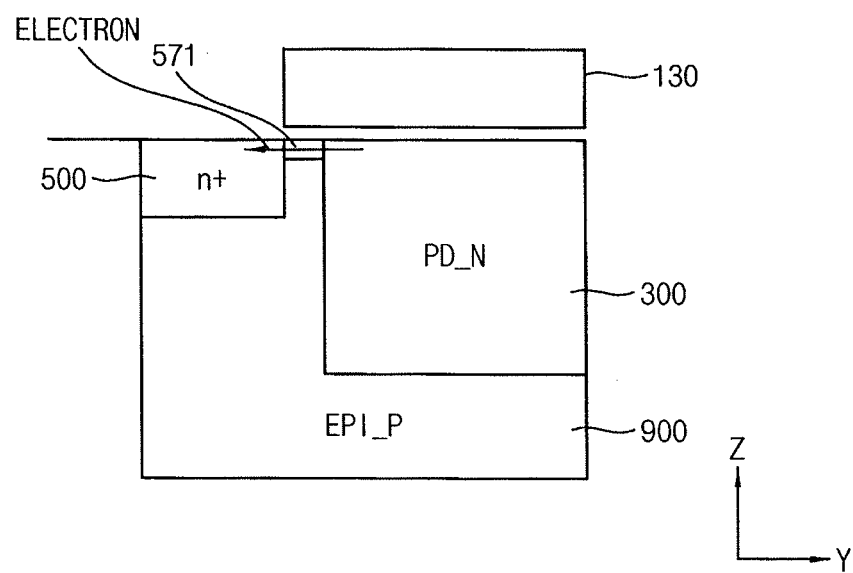
FIG. 6 illustrates an example of reset mode operation of the unit pixel.

FIG. 5 illustrates an example of a timing diagram operating the unit pixel 10a of FIG. 1, and FIG. 6 illustrates a cross-sectional diagram for describing reset mode operation of the unit pixel of FIG. 1.

Referring to FIGS. 5 and 6, the gate voltage VG may be a positive voltage level during a time interval of the reset mode, in which the photo diode 300 is initialized by a reset voltage VRST applied to the reset drain region 500. When the unit pixel 10a is operating in the reset mode, the reset voltage VRST is applied to the reset drain region 500. When the reset voltage VRST is applied to the reset drain region 500, the reset channel 571 is formed between the photo diode 300 and the reset drain region 500 in response to the gate voltage VG. When the reset channel 571 is formed between the photo diode 300 and the reset drain region 500, the photo-charge is transferred from the photo diode 300 to the reset drain region 500 through the reset channel 571 between the photo diode 300 and the reset drain region 500.

For example, when the photo diode 300 is doped with the N-type dopant, the reset drain region 500 may be doped with the N-type dopant. If the gate voltage VG is a predetermined voltage (e.g., 2 V), the reset channel 571 is formed between the photo diode 300 and the reset drain region 500 in response to the gate voltage VG. When the reset voltage VRST applied to the reset drain region 500 is a predetermined voltage (e.g., 2.8V), the voltage difference occurs between the photo diode 300 and the reset drain. In this case, electrons are transferred from the photo diode 300 to the reset drain region 500 through the reset channel 571.

Figure 7:
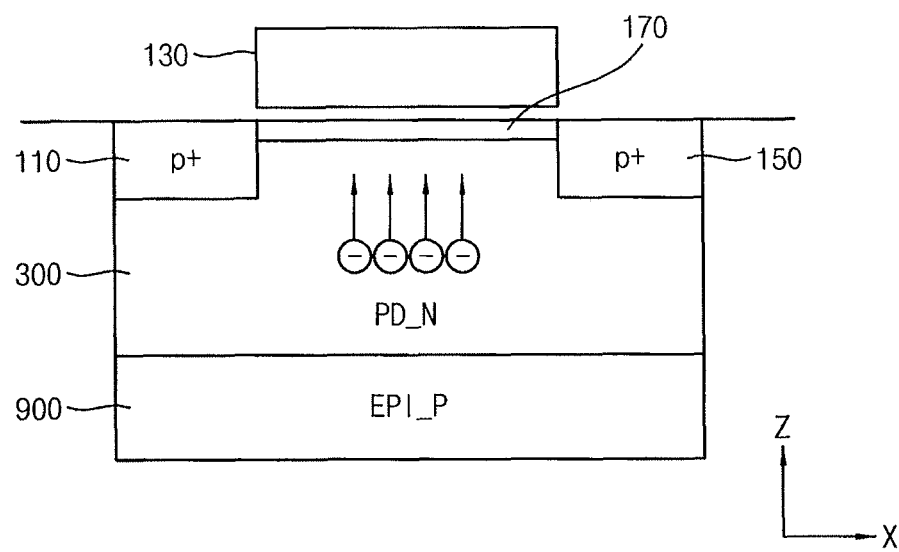
FIG. 7 illustrates an example of integration mode operation of the unit pixel.

FIG. 7 illustrates a cross-sectional diagram for describing the integration mode operation of the unit pixel of FIG. 1. Referring to FIGS. 5 and 7, the gate voltage VG may be a ground voltage level or a negative voltage level between the ground voltage level and a read voltage during a time interval of the integration mode. During integration mode, the photo diode 300 converts incident light to a photo-charge.

For example, a ground voltage may be applied to the gate voltage line VGL. When the ground voltage is applied to the gate voltage line VGL, the read channel 171 is not formed in the read channel region 170 in the sensing transistor 100, and the reset channel 571 is not formed in the reset channel region 570 between the photo diode 300 and the reset drain region 500. In this case, the photo diode 300 converts incident light to a photo-charge. The photo diode 300 may store the photo-charge converted from the incident light. For example, if the photo diode 300 is doped with the N-type dopant, electrons move into the upper region of the photo diode 300 during the integration mode. The electrons moving into the upper region of the photo diode 300 may change the amount of the sensing current IS.

Figure 8:
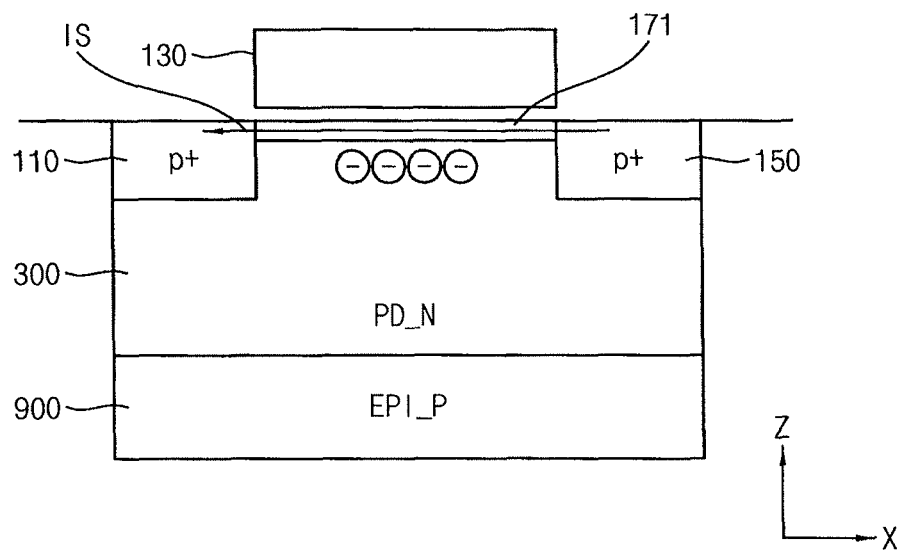
FIG. 8 illustrates an example of read mode operation of the unit pixel.

FIG. 8 illustrates a cross-sectional diagram for describing the read mode operation of the unit pixel of FIG. 1. Referring to FIGS. 5 and 8, the gate voltage VG may be a negative voltage level during a time interval of a read mode. In the read mode, a sensing current is transferred between the reference active region 110 applied by the reference voltage VR and the output active region 150 connected to an output line by turning-on the sensing transistor 100.

For example, if the reference active region 110 is doped with the P-type dopant, the output active region 150 may be doped with the P-type dopant. If the gate voltage VG has a predetermined value (e.g., −1.4V), the sensing transistor 100 is turned-on in response to the gate voltage VG. When the sensing transistor 100 is turned-on, the reference active region 110 and the output active region 150 are electrically connected through the read channel 171 in the read channel region 170. If the read channel 171 is formed, the sensing current IS is transferred through the read channel 171 between the reference active region 110 and the output active region 150.

The electrons moving into the upper region of the photo diode 300 during the integration mode changes the amount of the sensing current IS. The changed amount of the sensing current IS corresponds to amount of the photo-charge converted from the incident light in the integration mode. The sensing current IS is increased as a photo-charge quantity included in the photo diode 300 is increased.

In one embodiment, a negative reference voltage VR is applied to the reference active region 110 and a positive reset voltage VRST is applied to the reset drain region 500. For example, if the reference active region 110 and the output active region 150 are doped with the P-type dopant, the sensing transistor 100 is a PMOS sensing transistor 100. The reset drain is doped with the N-type dopant. The negative reference voltage of a predetermined value (e.g., −1V) may be applied to the reference active region 110. When the reset channel 571 is formed between the photo diode 300 and the reset drain region 500 in response to the gate voltage VG, the reset voltage VRST is a predetermined value, e.g., 2.8V. When the reset voltage VRST is this value, the electrons in the photo diode 300 is transferred to the reset drain region 500 through the reset channel 571.

Figure 9:
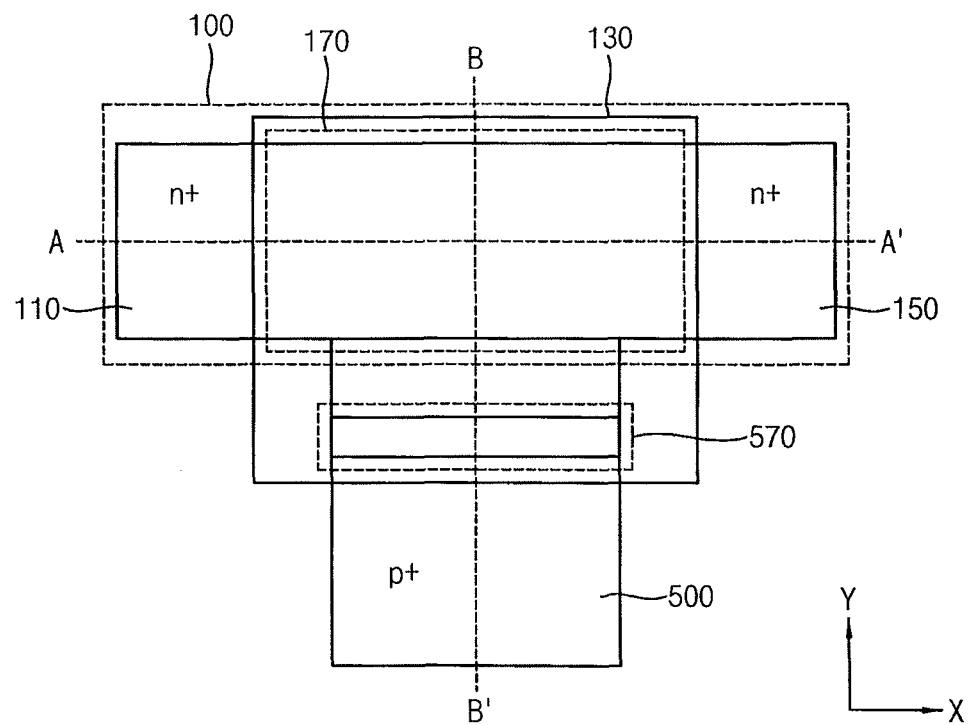
FIG. 9 illustrates another embodiment of a unit pixel.
Figure 10:
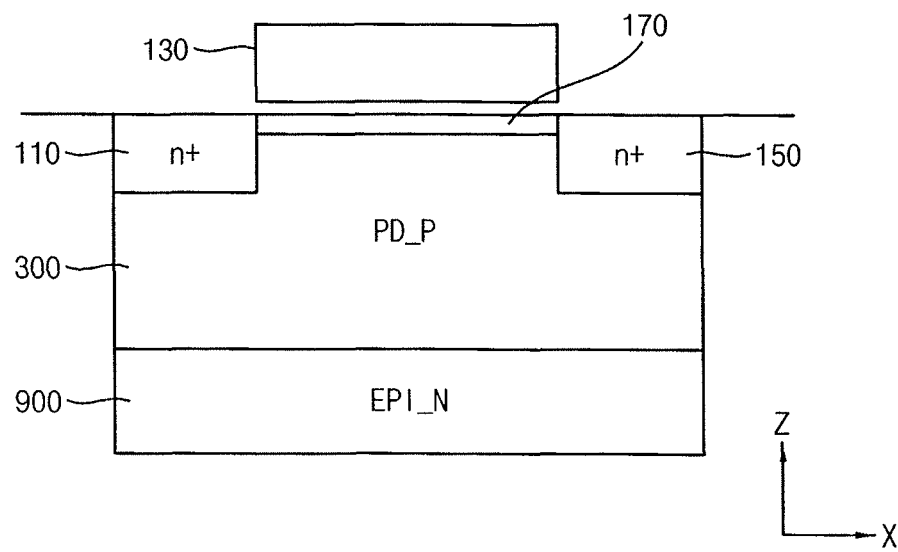
FIG. 10 illustrates a view taken along section line A-A' in FIG. 9.
Figure 11:
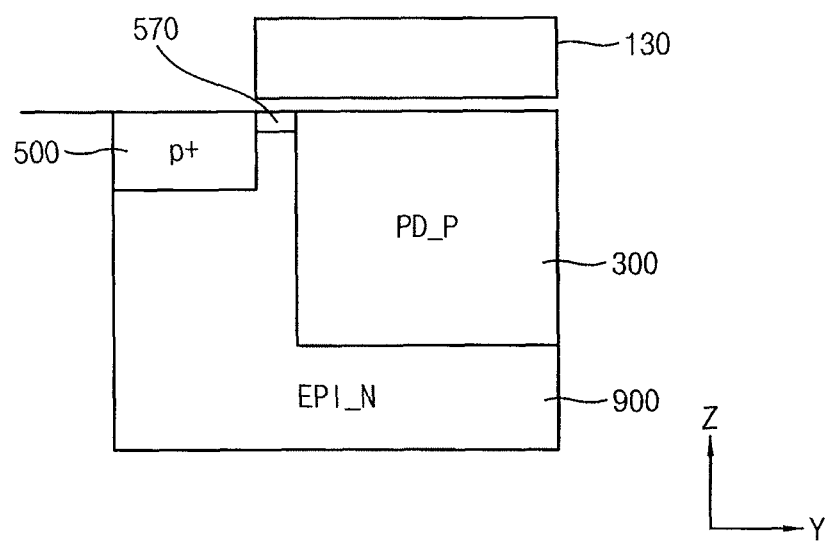
FIG. 11 illustrates a view taken along section line B-B' in FIG. 9.

FIG. 9 illustrates another embodiment of a unit pixel 10c, FIG. 10 illustrates a cross-sectional view taken along section line A-A' in FIG. 9, and FIG. 11 illustrates a cross-sectional view taken along section line B-B' in FIG. 9.

Referring to FIGS. 9 to 11, the unit pixel 10c includes a sensing transistor 100, a photo diode 300, a reset drain region 500, and an epitaxial region 900. The sensing transistor 100 includes a reference active region 110, an output active region 150, and a gate. The reference active region 110 and the output active region 150 are doped with an N-type dopant. The photo diode 300 and the reset drain region 500 are doped with a P-type dopant.

For example, if the reference active region 110 and the output active region 150 are doped with the N-type dopant, the sensing transistor 100 is an NMOS sensing transistor 100. In this case, if the gate voltage VG is positive, the sensing transistor 100 is turned-on. When the sensing transistor 100 is turned-on, the read channel 171 is formed in the read channel region 170. Also, if the gate voltage VG is positive, the reset channel 571 is not formed in reset channel region 570 between the photo diode 300 and the reset drain region 500.

For example, if the gate voltage VG is negative, the sensing transistor 100 is turned-off. When the sensing transistor 100 is turned-off, the read channel 171 is not formed in the read channel region 170. Also, if the gate voltage VG is negative, the reset channel 571 is formed in reset channel region 570 between the photo diode 300 and the reset drain region 500.

The reference active region 110 and the output active region 150 in the sensing transistor 100 is electrically connected through the read channel 171 in the read channel region 170 in response to the gate voltage VG. When the read channel 171 is formed, the sensing current IS is transferred through the read channel 171 between the reference active region 110 and the output active region 150.

The reset drain region 500 and the photo diode 300 in the sensing transistor 100 is electrically connected through the reset channel 571 in the reset channel region 570 in response to the gate voltage VG. When the reset channel 571 is formed, the photo-charge may be transferred from the photo diode 300 to the reset drain region 500 through the reset channel 571 between the photo diode 300 and the reset drain region 500.

The unit pixel 10c allows an image sensor to be reduced in size by using fewer transistors than other arrangements, while simultaneously increasing the resolution of the image sensor.

Figure 12:
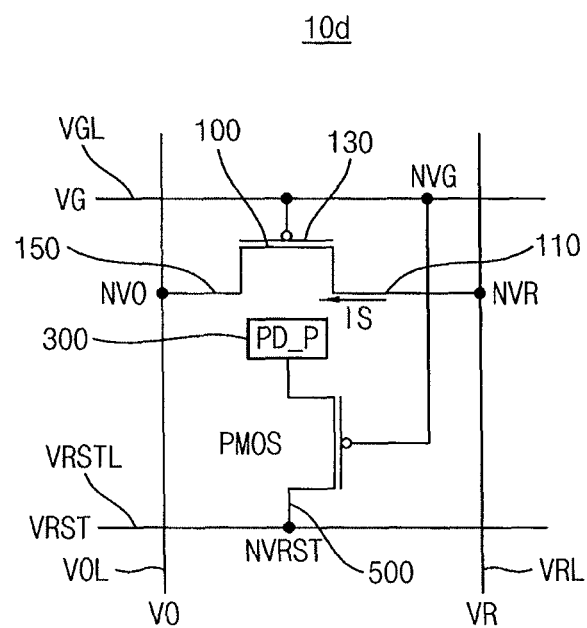
FIG. 12 illustrates an equivalent circuit of the unit pixel.

FIG. 12 illustrates an example of an equivalent circuit 10d of the unit pixel 10c of FIG. 9. Referring to FIGS. 9 and 12, the unit pixel 10d includes a sensing transistor 100, a photo diode 300, and a reset drain region 500. The sensing transistor 100 includes a reference active region 110, an output active region 150, and a gate.

The reference active region 110 may be connected to the reference voltage line VRL through a reference voltage node NVR. The reference voltage VR applied to the reference voltage line VRL is transferred to the reference active region 110 through the reference voltage node NVR. The gate may be connected to the gate voltage line VGL through a gate voltage node NVG. The gate voltage VG applied to the gate voltage line VGL is transferred to the gate through the gate voltage node NVG.

The reset drain region 500 may be connected to the reset voltage line VRSTL through a reset voltage node NVRST. The reset voltage VRST applied to the reset voltage line VRSTL is transferred to the reset drain region 500 through the reset voltage node NVRST.

The output active region 150 may be connected to the output voltage line VOL through an output voltage node NVO. The output voltage VO applied to the output voltage line VOL is transferred to the output active region 150 through the output voltage node NVO.

Figure 13:
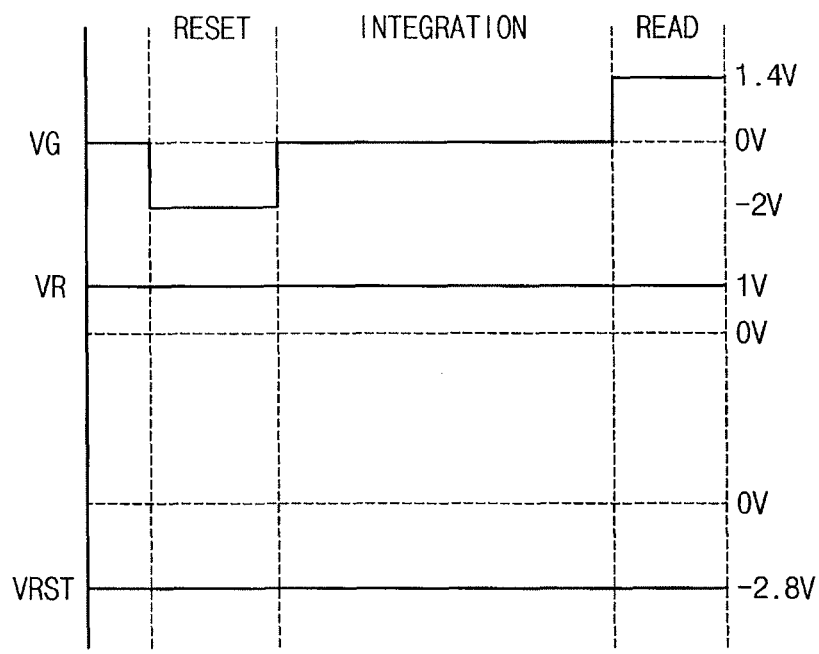
FIG. 13 illustrates operation of the unit pixel.
Figure 14:
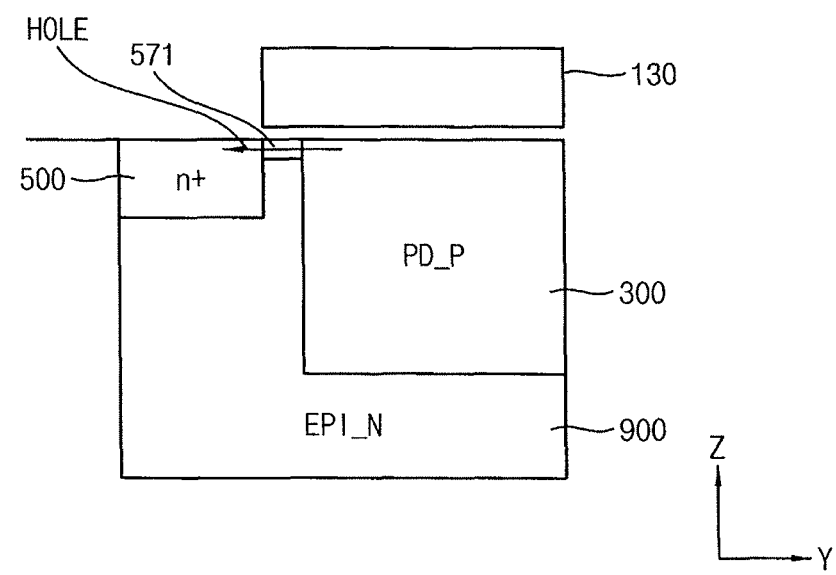
FIG. 14 illustrates an example of reset mode operation of the unit pixel.

FIG. 13 illustrates an example of a timing diagram for operating the unit pixel 10*c* of FIG. 9, and FIG. 14 illustrates a reset mode operation of the unit pixel 10*c* of FIG. 9.

Referring to FIGS. 13 and 14, the gate voltage VG is a negative voltage level during a time interval of a reset mode, in which the photo diode 300 is initialized by a reset voltage VRST applied to the reset drain region 500. When the unit pixel 10*c* is operating in the reset mode, the reset voltage VRST is applied to the reset drain region 500. When the reset voltage VRST is applied to the reset drain region 500, the reset channel 571 is formed between the photo diode 300 and the reset drain region 500 in response to the gate voltage VG. When the reset channel 571 is formed between the photo diode 300 and the reset drain region 500, the photo-charge is transferred from the photo diode 300 to the reset drain region 500 through the reset channel 571 between the photo diode 300 and the reset drain region 500.

For example, if the photo diode 300 is doped with the P-type dopant, the reset drain region 500 is doped with the P-type dopant. If the gate voltage VG is a predetermined value (e.g., −2 V), the reset channel 571 is formed between the photo diode 300 and the reset drain region 500 in response to the gate voltage VG. When the reset voltage VRST applied to the reset drain region 500 is a predetermined voltage (e.g., −2.8V), the voltage difference may be caused between the photo diode 300 and the reset drain. In this case, holes may be transferred from the photo diode 300 to the reset drain region 500 through the reset channel 571.

Figure 15:
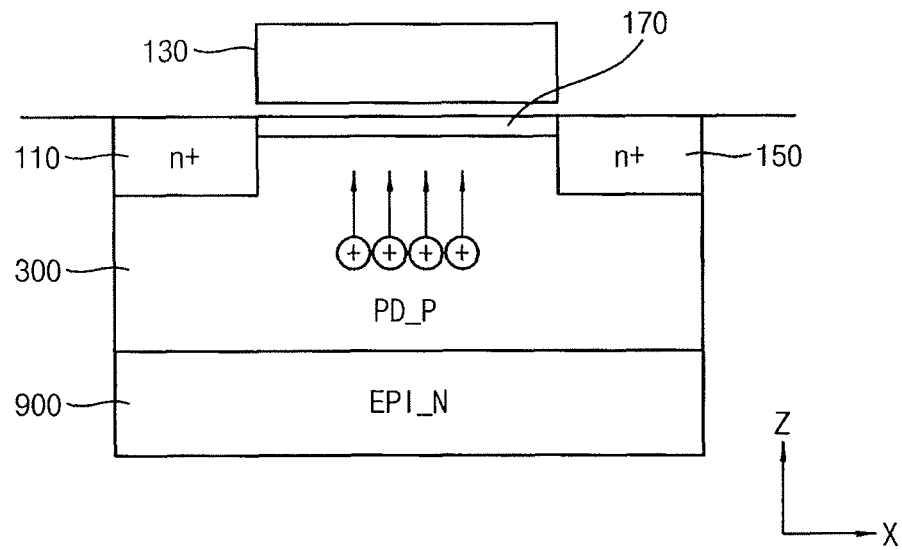
FIG. 15 illustrates an example of integration mode operation of the unit pixel.

FIG. 15 illustrates an example of integration mode operation of the unit pixel 10*c* of FIG. 9. Referring to FIGS. 13 and 15, the gate voltage VG may be a ground voltage level during a time interval of an integration mode, in which the photo diode 300 converts incident light to a photo-charge.

For example, if the ground voltage is applied to the gate voltage line VGL, the read channel 171 is not formed in the read channel region 170 in the sensing transistor 100, and the reset channel 571 is not formed in the reset channel region 570 between the photo diode 300 and the reset drain region 500. The photo diode 300 converts incident light to a photo-charge. For example, if the photo diode 300 is doped with the P-type dopant, holes may move into the upper region of the photo diode 300 during the integration mode. Electrons moving into the upper region of the photo diode 300 changes the amount of the sensing current IS.

Figure 16:
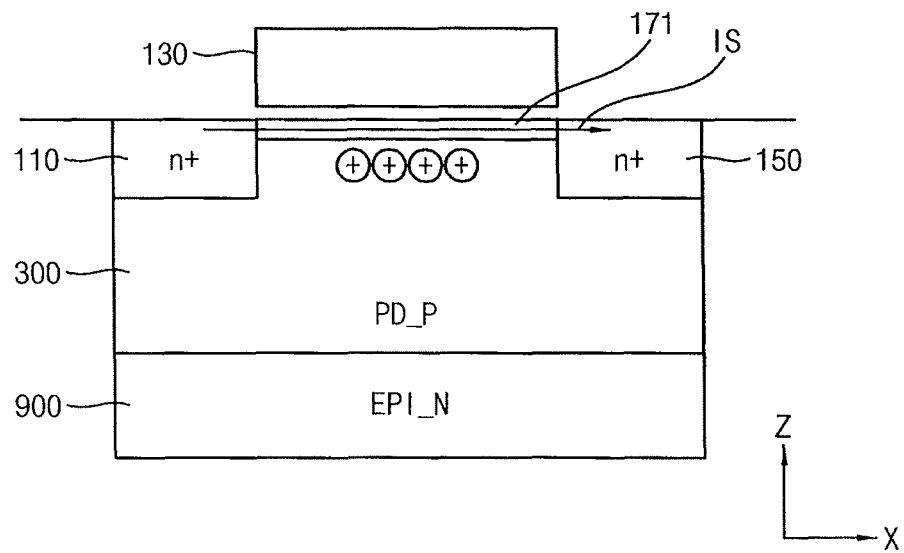
FIG. 16 illustrates an example of read mode operation of the unit pixel.

FIG. 16 illustrates an example of read mode of the operation of the unit pixel 10*c* of FIG. 9. Referring to FIGS. 13 and 16, the gate voltage VG may be a positive voltage level during a time interval of a read mode. In read mode, a sensing current is transferred between the reference active region 110 applied by the reference voltage VR and the output active region 150 connected to an output line by turning-on the sensing transistor 100.

For example, if the reference active region 110 is doped with the N-type dopant, the output active region 150 may be doped with the N-type dopant. If the gate voltage VG is a predetermined value (e.g., 1.4V), the sensing transistor 100 is turned-on in response to the gate voltage VG. When the sensing transistor 100 is turned-on, the reference active region 110 and the output active region 150 may be electrically connected through the read channel 171 in the read channel region 170. When the read channel 171 is formed, the sensing current IS is transferred through the read channel 171 between the reference active region 110 and the output active region 150. Holes moving into the upper region of the photo diode 300 during the integration mode change the amount of the sensing current IS. The changed amount of the sensing current IS corresponds to amount of the photo-charge converted from the incident light in the integration mode.

The reference active region 110 and the output active region 150 in the sensing transistor 100 is electrically connected through the read channel 171 in the read channel region 170 in response to the gate voltage VG. When the read channel 171 is formed, the sensing current IS is transferred through the read channel 171 between the reference active region 110 and the output active region 150. The reset drain region 500 and the photo diode 300 in the sensing transistor 100 is electrically connected through the reset channel 571 in the reset channel region 570 in response to the gate voltage VG. When the reset channel 571 is formed, the photo-charge is transferred from the photo diode 300 to the reset drain region 500 through the reset channel 571 between the photo diode 300 and the reset drain region 500.

Figure 17:
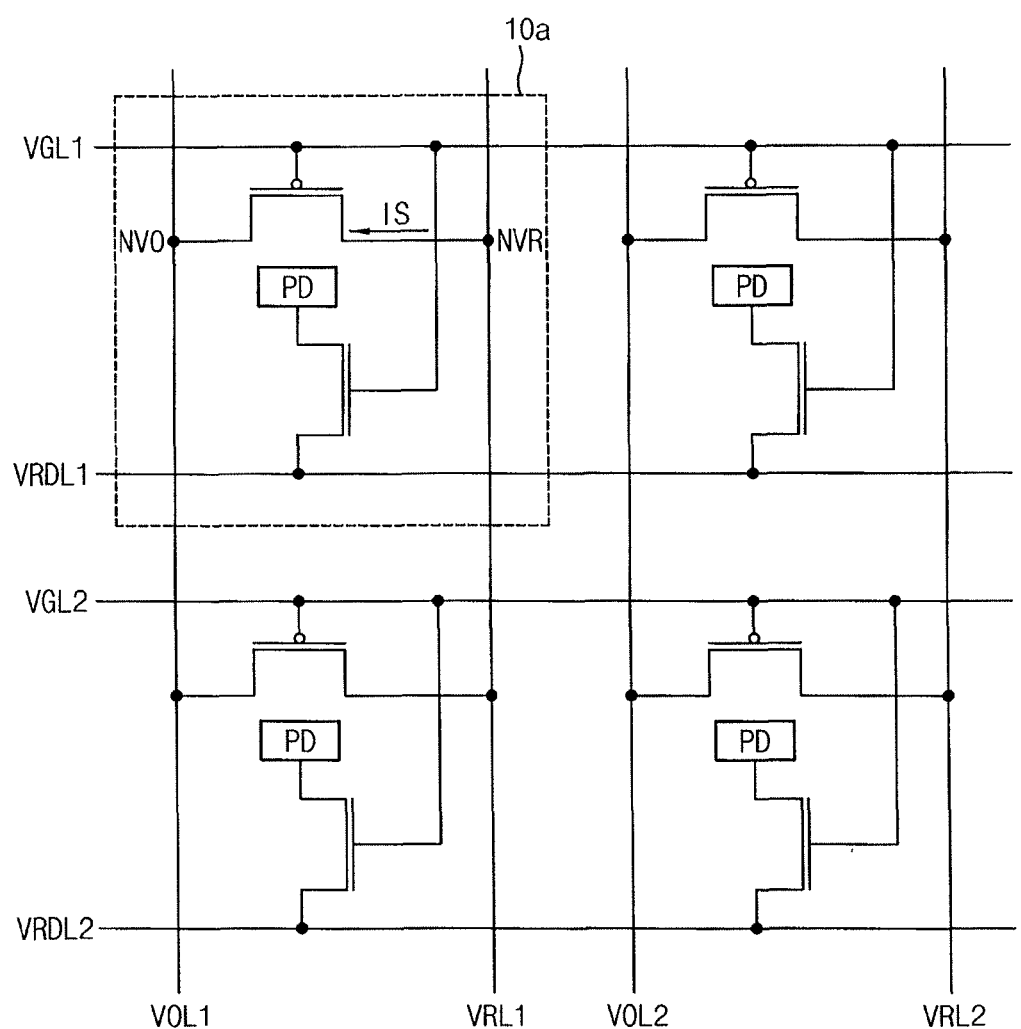
FIG. 17 illustrates an embodiment of an image pixel array.

FIG. 17 illustrates an embodiment of an image pixel array 20*a* which includes a plurality of unit pixels. The unit pixels may be unit pixels 10*a* or 10*c*. For illustrative purposes, the image pixel array 20*a* will be described as including unit pixels 10*a*.

The plurality of unit pixels 10*a* are connected to a plurality of gate voltage lines VGL, a plurality of reference voltage lines VRL, a plurality of reset voltage lines VRSTL, and a plurality of output lines. Each unit pixel 10*a* includes a sensing transistor 100, a photo diode 300, and a reset drain region 500. The sensing transistor 100 includes a reference active region 110 receiving a reference voltage VR, an output active region 150 providing an output signal and a gate. The gate is formed between the reference active region 110 and the output active region 150 on a semiconductor substrate to electrically connect the reference active region 110 to the output active region 150 in response to a gate voltage VG. The reference active region 110 and the output active region 150 are formed inside the semiconductor substrate. The photo diode 300 is formed under the gate inside the semiconductor substrate. The reset drain region 500 is formed inside the semiconductor substrate to be electrically connected to the photo diode 300 by the gate in response to the gate voltage VG.

The reference active region 110 and the output active region 150 are doped with a P-type dopant or an N-type dopant. The gate includes a transparent conducting oxide or a non-transparent conducting oxide. For example, in case light incident on the unit pixel 10*a* passes through an upper surface of a semiconductor substrate, the gate is formed with the transparent conducting oxide. In case light incident on the unit pixel 10*a* passes through a lower surface of the semiconductor substrate, the gate is formed with the non-transparent conducting oxide.

The reference active region 110 formed in the semiconductor substrate is connected to a reference voltage line VRL and receive the reference voltage VR. The output active region 150 is connected to an output voltage line VOL and transfers an output voltage VO. The gate may be connected to a gate voltage line VGL and receive the gate voltage VG. For example, when the sensing transistor 100 is turned-on in response to the gate voltage VG, the reference active region 110 and the output active region 150 are electrically connected through a read channel 171 in the read channel region 170. When the read channel 171 is formed, sensing current IS is transferred through the read channel 171 between the reference active region 110 and the output active region 150.

The photo diode 300 is formed under the gate inside the semiconductor substrate. The photo diode 300 may be doped with the P-type dopant or the N-type dopant. For example, if the photo diode 300 is doped with the P-type dopant, while the unit pixel 10a is operating in the integration mode, holes move into the upper region of the photo diode 300. If the photo diode 300 is doped with the N-type dopant, while the unit pixel 10a is operating in the integration mode, electrons move into the upper region of the photo diode 300.

The reset drain region 500 may be doped with the P-type dopant or the N-type dopant. For example, if the photo diode 300 is doped with the P-type dopant, the reset drain region 500 may be doped with the P-type dopant. If the photo diode 300 is doped with the N-type dopant, the reset drain region 500 is doped with the N-type dopant.

The reset drain region 500 formed in the semiconductor substrate may be connected to a reset voltage line VRSTL and receive a reset voltage VRST. When the reset channel 571 in the reset channel region 570 is formed in response to the gate voltage VG, the photo-charge may be transferred from the photo diode 300 to the reset drain region 500 through the reset channel 571 between the photo diode 300 and the reset drain region 500.

For example, if the reset drain region 500 and the photo diode 300 are doped with the P-type dopant, the reset voltage VRST transferred to the reset drain region 500 is a negative voltage and the photo-charge transferred through the reset channel 571 may be a hole. If the reset drain region 500 and the photo diode 300 are doped with the N-type dopant, the reset voltage VRST transferred to the reset drain region 500 is a positive voltage and the photo-charge transferred through the reset channel 571 may be an electron.

The operation mode of the image pixel array 20a including the unit pixels 10a includes a reset mode, an integration mode, and a read mode. In the reset mode, the photo diode 300 is initialized by a reset voltage VRST applied to the reset drain region 500. In the integration mode, the photo diode 300 converts incident light to a photo-charge. In the read mode, a sensing current is transferred between the reference active region 110 and the output active region 150 by turning-on the sensing transistor 100.

For example, if unit pixel 10a is operating in the reset mode, the reset voltage VRST is applied to the reset drain region 500. When the reset voltage VRST is applied to the reset drain region 500, the reset channel 571 is formed between the photo diode 300 and the reset drain region 500 in response to the gate voltage VG. When the reset channel 571 is formed between the photo diode 300 and the reset drain region 500, the photo-charge is transferred from the photo diode 300 to the reset drain region 500 through the reset channel 571 between the photo diode 300 and the reset drain region 500.

For example, when the unit pixel 10a is operating in the integration mode, a ground voltage may be applied to the gate voltage line VGL. When the ground voltage is applied to the gate voltage line VGL, the read channel 171 is not formed in the read channel region 170 in the sensing transistor 100, and the reset channel 571 is not formed in the reset channel region 570 between the photo diode 300 and the reset drain region 500. In this case, the photo diode 300 converts incident light to a photo-charge.

For example, if the unit pixel 10a is operating in the read mode, and if the gate voltage VG is applied to the gate voltage line VGL, the sensing transistor 100 is turned-on in response to the gate voltage VG. When the sensing transistor 100 is turned-on, the reference active region 110 and the output active region 150 are electrically connected through the read channel 171 in the read channel region 170. When the read channel 171 is formed, the sensing current IS is transferred through the read channel 171 between the reference active region 110 and the output active region 150.

The reference active region 110 and the output active region 150 in the sensing transistor 100 is electrically connected through the read channel 171 in the read channel region 170 in response to the gate voltage VG. When the read channel 171 is formed, the sensing current IS is transferred through the read channel 171 between the reference active region 110 and the output active region 150. The reset drain region 500 and the photo diode 300 in the sensing transistor 100 is electrically connected through the reset channel 571 in the reset channel region 570 in response to the gate voltage VG.

When the reset channel 571 is formed, the photo-charge is transferred from the photo diode 300 to the reset drain region 500 through the reset channel 571 between the photo diode 300 and the reset drain region 500. Whether unit pixels 10a or unit pixels 10c are used, the unit pixels allow the size of an image sensor to be reduced by using fewer transistors than other arrangements, while simultaneously increasing the resolution of the image sensor.

Figure 18:
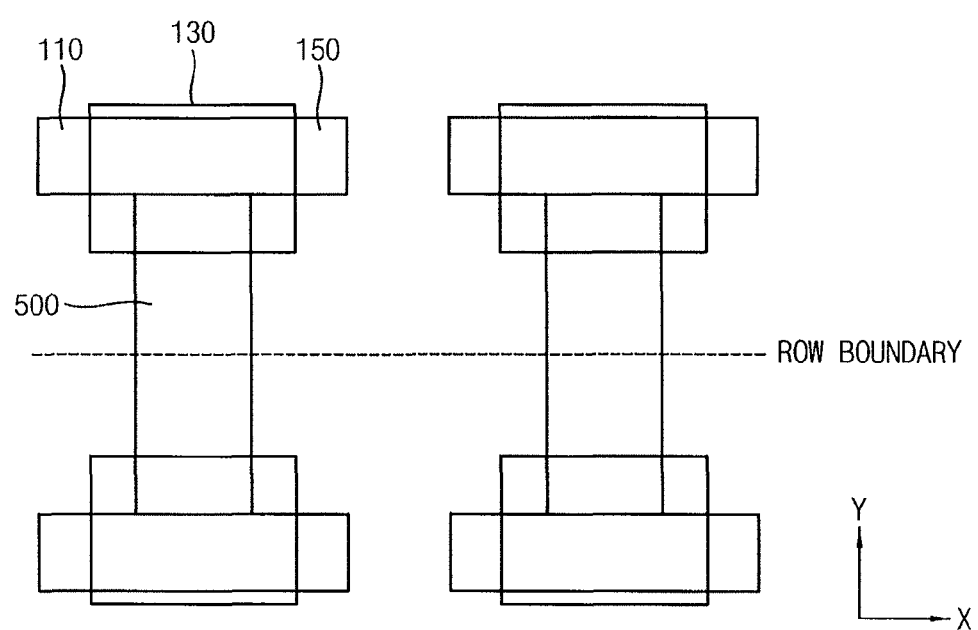
FIG. 18 illustrates an example of placement of unit pixels.
Figure 19:
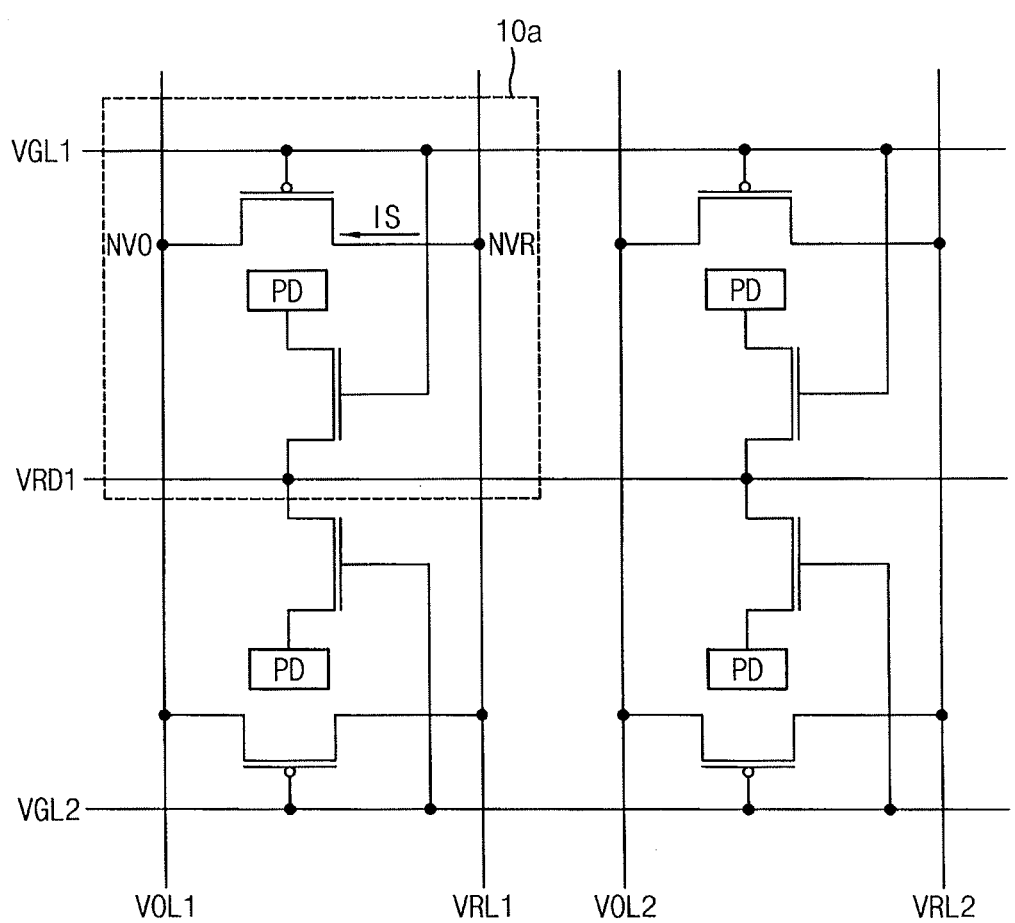
FIG. 19 illustrates an embodiment of an image pixel array in FIG. 18.

FIG. 18 illustrates placement of the unit pixels according to one embodiment, and FIG. 19 illustrates an example of a circuit diagram the image pixel array 20a according to the placement the unit pixels in FIG. 18. The unit pixels may be unit pixels 10a or unit pixels 10c. For illustrative purposes, the following description will be given for unit pixels 10a.

Referring to FIGS. 18 and 19, the two unit pixels 10a are respectively placed in two adjacent rows. The unit pixels 10a may share the reset drain region 500 by being symmetrically placed based on a boundary line extending in a row direction. If the two unit pixels 10a share the reset drain region 500, a space of the reset drain region 500 in the unit pixel 10a is decreased. As a result, the size of the unit pixel 10a is decreased.

Figure 20:
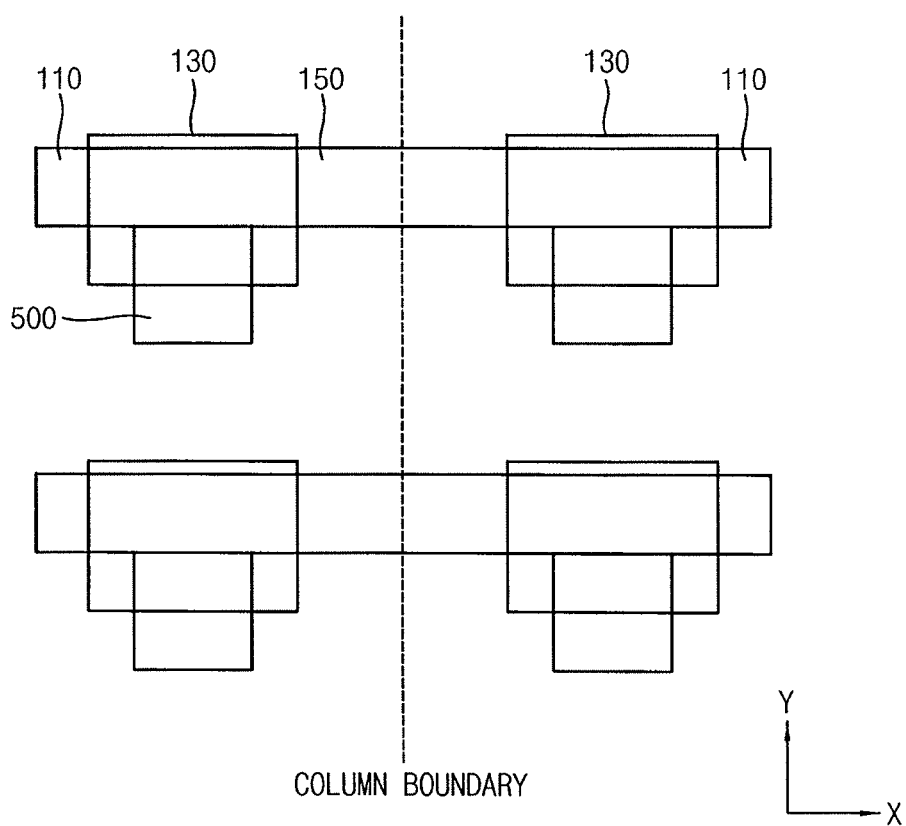
FIG. 20 illustrates another example of a placement of unit pixels.
Figure 21:
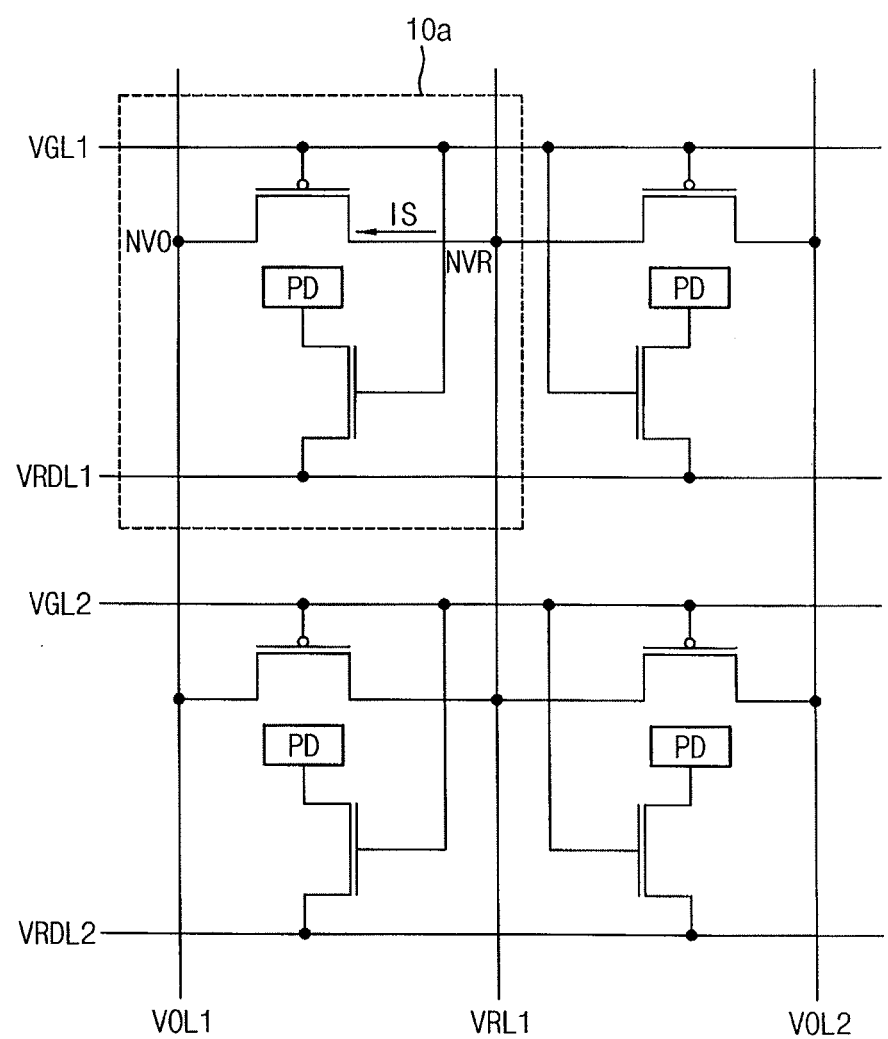
FIG. 21 illustrates another embodiment of an image pixel array.

FIG. 20 illustrates placement of unit pixels according to another embodiment, and FIG. 21 illustrates a circuit diagram of an image pixel array using the placement of unit pixels in FIG. 20. As with the aforementioned embodiments, the unit pixels may be unit pixels 10a or 10c. For illustrative purposes only, the following description is given for unit pixels 10a.

Referring to FIGS. 20 and 21, the two unit pixels 10a are respectively placed in two adjacent columns. The two unit pixels 10a may share the reference active region 110 by being symmetrically placed based on a boundary line of a column direction. If the two unit pixels 10a share the reference active region 110, a space of the reference active region 110 in the unit pixel 10a is decreased. As a result, the size of the unit pixel 10a is decreased.

In another embodiment, the two unit pixels 10a or 10c are respectively placed in two adjacent rows and may share the reset drain region 500 by being symmetrically placed based on a boundary line of a row direction. Also, two unit pixels 10a or 10c are respectively placed in adjacent two columns and may share the reference active region 110 by being symmetrically placed based on a boundary line of a column direction. If the two unit pixels 10a or 10c in the adjacent rows share the reset drain region 500 and the two unit pixels 10a and 10c in the adjacent columns share the reference active region 110, a space of the reset drain region 500 and the reference active region 110 in the unit pixel 10a or 10c is decreased. As a result, the size of the unit pixel 10a or 10c is decreased.

Figure 22:
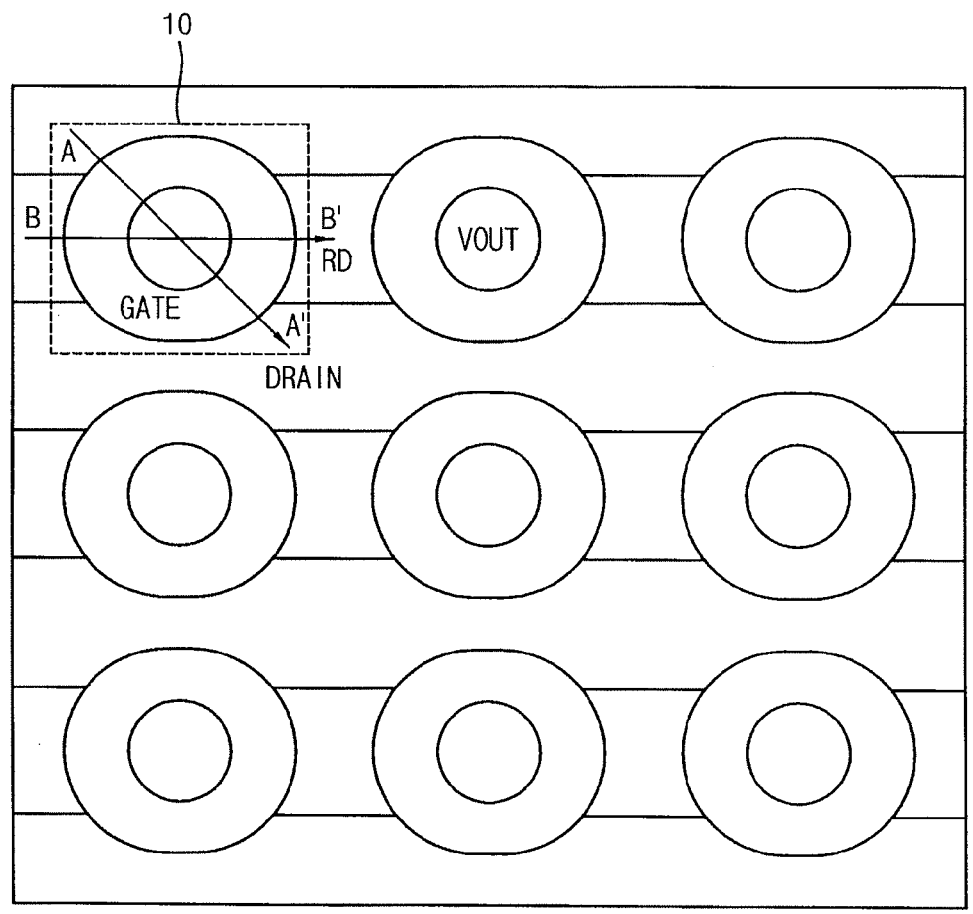
FIG. 22 and FIG. 23 illustrate another example of placement of unit pixels.
Figure 23:
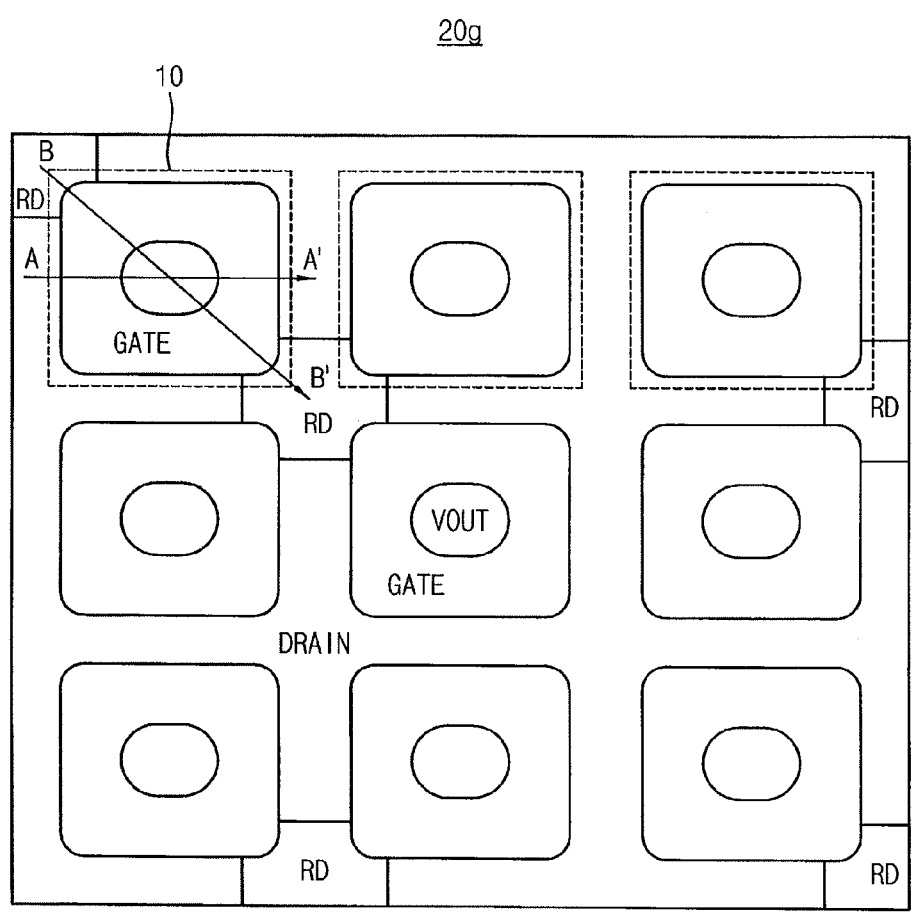
Figure 24:
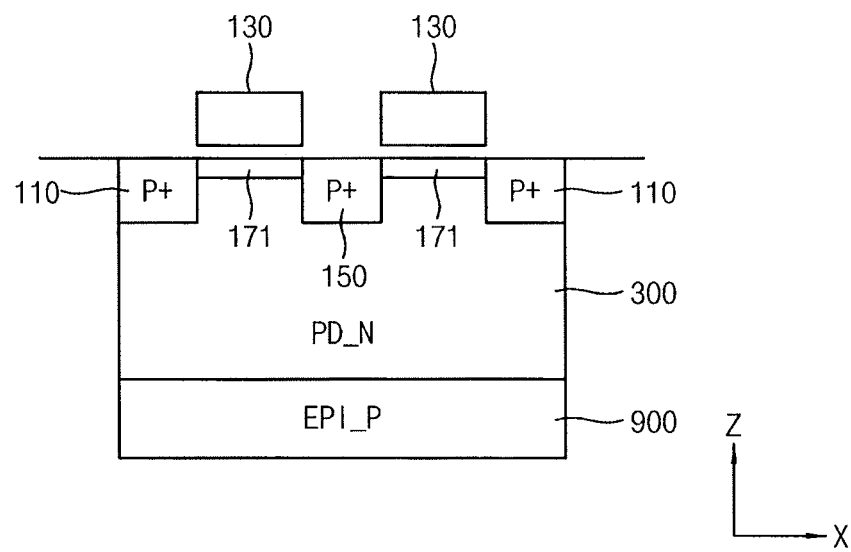
FIG. 24 illustrates a view taken along section line A-A' in FIGS. 22 and 23.
Figure 25:
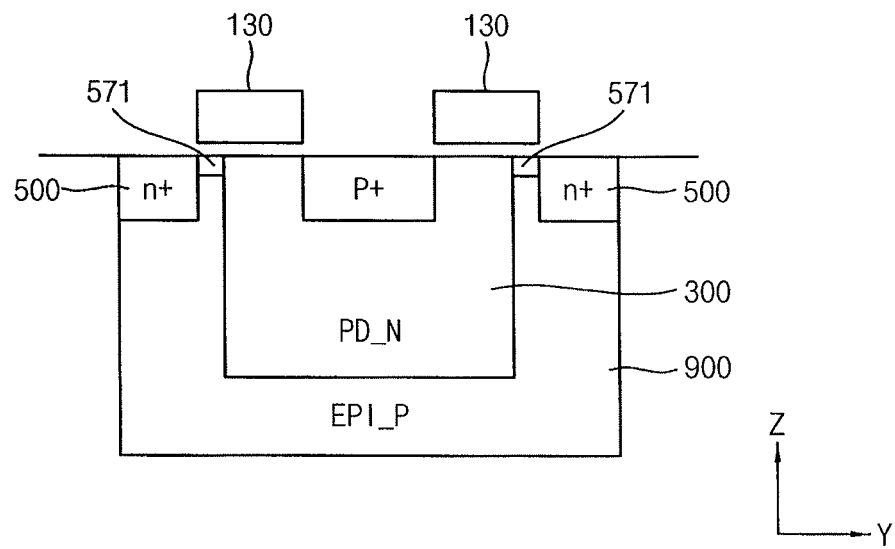
FIG. 25 illustrates a view taken along section line B-B' in FIGS. 22 and 23.

FIGS. 22 and 23 illustrate placement of unit pixels 10 in respective image pixel arrays 20f and 20g according to other embodiments, FIG. 24 is a cross-sectional diagram illustrating an example of a vertical structure cutting one of the unit pixels 10 in FIGS. 22 and 23 along line A-A', and FIG. 25 is a cross-sectional diagram illustrating an example of a vertical structure cutting one of the unit pixels 10 in FIGS. 22 and 23 along line B to B'.

Referring to FIGS. 22 to 25, the unit pixel 10 includes a sensing transistor 100, a photo diode 300, a reset drain region 500, and an epitaxial region 900. The sensing transistor 100 includes a reference active region 110, an output active region 150, and a gate. The reference active region 110 and the output active region 150 are formed inside the semiconductor substrate.

The gate is formed between the reference active region 110 and the output active region 150 on a semiconductor substrate, to electrically connect the reference active region 110 to the output active region 150 in response to a gate voltage VG.

In one embodiment, the gate may be formed on the semiconductor substrate to cover the output active region 150 with a predetermined shape, e.g., a ring shape or a square shape. The reset drain region 500 and the reference active region 110 may be shared by the unit pixels 10. For example, the unit pixels in the image pixel array 20f and 20g may be symmetrically placed based on the reference active region 110. When the unit pixels are symmetrically placed based on the reference active region 110, the read channel 171 is formed from the output active region 150 to the reference active region 110 according to the X-axis.

For example, the unit pixels 10 in the image pixel array 20f and 20g may be symmetrically placed based on the reset drain region 500. When the unit pixels are symmetrically placed based on the reset drain region 500, the reset channel 571 is formed from the output active region 150 to the reference active region 110 according to the Y-axis. If the two unit pixels share the reset drain region 500 and the reference active region 110, a space of the reset drain region 500 and the reference active region 110 in the unit pixel 10 is decreased. As a result, the size of the unit pixel 10 is decreased.

Figure 26:
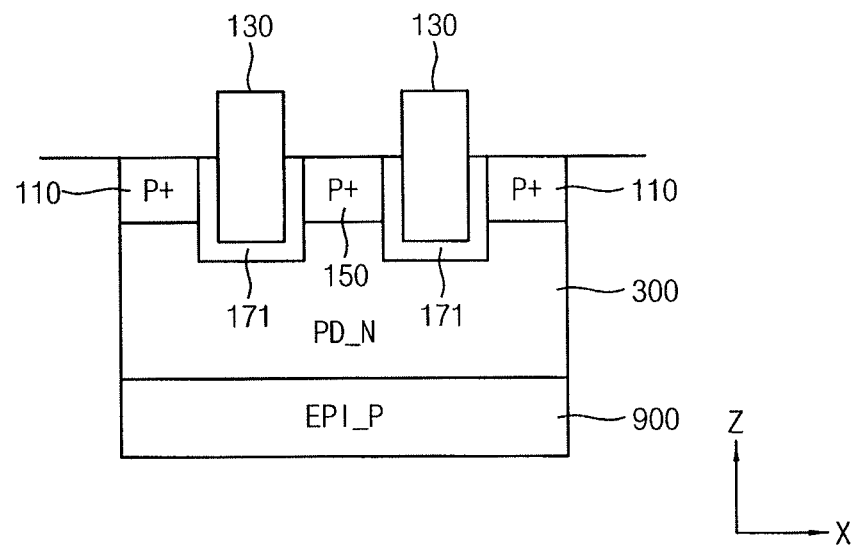
FIG. 26 illustrates another example of a view taken alone section line A-A'.

FIG. 26 is a cross-sectional diagram illustrating another example of a vertical structure cutting the unit pixel 10 of FIGS. 22 and along line A-A'. Referring to FIG. 26, when the sensing transistor 100 is turned-on in response to the gate voltage VG, the reference active region 110 and the output active region 150 may be electrically connected through the read channel 171 in the read channel region 170. When the read channel 171 is formed, the sensing current IS is transferred through the read channel 171 between the reference active region 110 and the output active region 150.

The read channel 171 between the reference active region 110 and the output active region 150 may be a recess channel. The recess channel may be formed by placing the gate to a predetermined depth (e.g., extending below a bottom surface of output active region 150) in the semiconductor substrate. When the gate is placed to the predetermined depth in the semiconductor substrate, the length of the read channel 171 between the reference active region 110 and the output active region 150 is increased.

Figure 27:
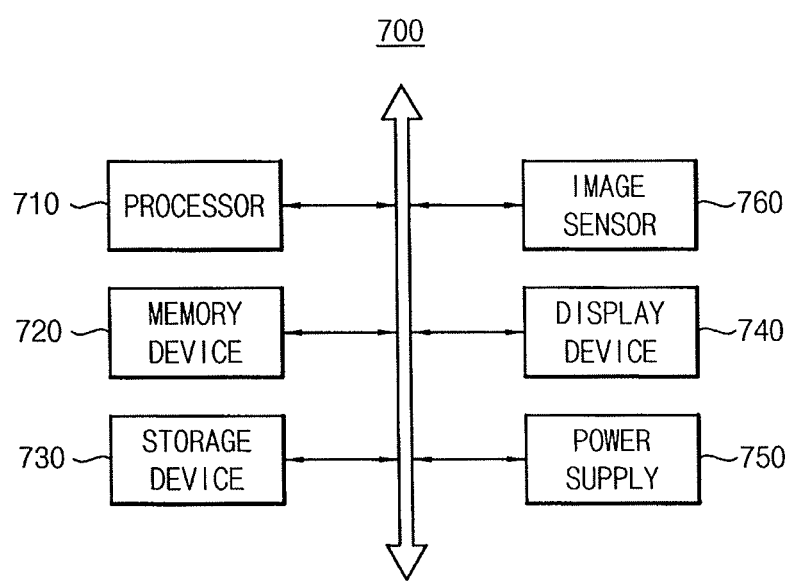
FIG. 27 illustrates an embodiment of a computing system.

FIG. 27 illustrates an embodiment of a computing system 700 including an image pixel array according to any of the aforementioned embodiments. Referring to FIG. 27, the computing system 700 includes a processor 710, a memory device 720, a storage device 730, a display device 740, a power supply 750, and an image sensor 760. The computing system 700 may further include one or more ports that communicate with a video card, a sound card, a memory card, a USB device, and/or other electronic devices.

The processor 710 may perform various calculations or tasks. The processor 710 may be, for example, a microprocessor, a CPU, or another type of signal processing device. The processor 710 may communicate with the memory device 720, the storage device 730, and the display device 740 via an address bus, a control bus, and/or a data bus. In one embodiment, the processor 710 may be coupled to an extended bus, e.g., a peripheral component interconnection (PCI) bus.

The memory device 720 may store data for operating the computing system 700. For example, the memory device 720 may be implemented as or to include a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 may include a data loading circuit.

The storage device 730 may be or include a solid state drive (SSD), a hard disk drive (HDD), a CD-ROM, or another type of storage device.

The computing system 700 may include an input device such as a touchscreen, a keyboard, a keypad, a mouse, and/or another type of input device, and an output device such as a printer, a display device, and/or another type of output device. The power supply 750 supplies operating voltages for the computing system 700.

The image sensor 760 may communicate with the processor 710 via the buses and/or other communication links. The image sensor 760 may be integrated with the processor 710 in one chip, or the image sensor 760 and the processor 710 may be implemented as separate chips.

At least a portion of the computing system 700 may be packaged in various forms. Examples include package-on-package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 700 may be a digital camera, a mobile phone, a smart phone, a portable multimedia player (PMP), a personal digital assistant (PDA), a computer, or another electronic device.

FIG. 28 illustrates an example of an interface in a computing system 1000, which, for example, may correspond to the computing system 700 of FIG. 27. Referring to FIG. 28, the computing system 1000 may be implemented, for example, by a data processing device that uses or supports a mobile industry processor interface (MIPI) interface and/or another type of interface.

The computing system 1000 may include an application processor 1110, an image sensor 1140, and a display device 1150. The display device 1150 may include the source driver. A CSI host 1112 of the application processor 1110 may perform serial communication with a CSI device 1141 of the image sensor 1140 via a camera serial interface (CSI). In one embodiment, the CSI host 1112 may include a deserializer (DES), and the CSI device 1141 may include a serializer (SER). A DSI host 1111 of the application processor 1110 may perform serial communication with a DSI device 1151 of the display device 1150 via a display serial interface (DSI). In one embodiment, the DSI host 1111 may include a serializer (SER), and the DSI device 1151 may include a deserializer (DES).

The computing system 1000 may further include a radio frequency (RF) chip 1160 for performing communications with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1120, a wireless local area network (WLAN) 1220, a worldwide interoperability for microwave access (WIMAX) 1130, etc. Other structures and interfaces of the electric device 1000 may also be used.

In accordance with one or more of the aforementioned embodiments, a unit pixel and image pixel array are provided which allows the size of an image sensor to be reduced by using fewer transistors than other arrangements, while simultaneously increasing a resolution of the image sensor.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A unit pixel, comprising:
    a sensing transistor including a reference active region, an output active region, and a gate, the gate located between the reference active region and the output active region on a semiconductor substrate to electrically connect the reference active region to the output active region based on a gate voltage, the reference active region and the output active region being within the semiconductor substrate;
    a photo diode under the gate within the semiconductor substrate; and
    a reset drain region within the semiconductor substrate to be electrically connected to the photo diode by the gate based on the gate voltage.

2. The unit pixel as claimed in claim 1, wherein:
    the gate is on the semiconductor substrate to cover part or all of a read channel region and a reset channel region,
    the read channel region is between the reference active region and the output active region, and
    the reset channel region is between the photo diode and reset drain region.

3. The unit pixel as claimed in claim 2, wherein:
    the reference active region is electrically connected to the output active region when the gate voltage is at a first voltage level,
    the reference region electrically connected to the output active region by a read channel on the semiconductor substrate of the read channel region, and
    the photo diode is electrically connected to the reset drain region when the gate voltage is at a second voltage level opposite in sign to the first voltage level, the photo diode electrically connected to the reset drain region by a reset channel on the semiconductor substrate of the reset channel region.

4. The unit pixel as claimed in claim 3, wherein:
    the reference active region is not electrically connected to the output active region when the gate voltage is a ground voltage level,
    the reference active region is not electrically connected to the output active region as a result of the read channel being deactivated, and
    the photo diode is not electrically connected to the reset drain region when the reset channel is deactivated.

5. The unit pixel as claimed in claim 1, wherein:
    the reference active region and the output active region are respectively on a first side and a second side of the photo diode along an axis extending in a first direction, and
    the reset drain region is on a third side of the photo diode along an axis extending in a second direction different from the first direction.

6. The unit pixel as claimed in claim 1, wherein: the reference active region and the output active region are doped with a P-type dopant, and the photo diode and the reset drain region are doped with an N-type dopant.

7. The unit pixel as claimed in claim 6, wherein:
    the gate voltage is at a positive voltage level during a reset mode, and
    the reset drain region receives a reset voltage to initialize the photo diode.

8. The unit pixel as claimed in claim 6, wherein:
    the gate voltage is a ground voltage level, or a negative voltage level between the ground voltage level and a read voltage, during an integration mode, and
    the photo diode converts incident light to a photo-charge.

9. The unit pixel as claimed in claim 6, wherein:
    the gate voltage is a negative voltage level during a read mode,
    a sensing current is transferred between the reference active region based on the reference voltage and the output active region, connected to an output line, by turning-on the sensing transistor.

10. The unit pixel as claimed in claim 9, wherein the sensing current is increased as a quantity of photo-charge in the photo diode is increased.

11. The unit pixel as claimed in claim 1, wherein:
    the reference active region and the output active region are doped with an N-type dopant, and
    the photo diode and the reset drain region are doped with a P-type dopant.

12. The unit pixel as claimed in claim 11, wherein:
    the gate voltage is a negative voltage level during a reset mode, and
    the reset drain region receives a reset voltage to initialize the photo diode,
    the gate voltage is a positive voltage level during a read mode,
    a sensing current is transferred between the reference active region applied by the reference voltage and the output active region, connected to an output line, by turning-on the sensing transistor.

13. An image pixel array, comprising:
a plurality of unit pixels connected to a plurality of gate voltage lines, a plurality of reference voltage lines, a plurality of reset voltage lines, and a plurality of output lines, each unit pixel of the plurality of the unit pixels including:
a sensing transistor including a gate, a reference active region receiving a reference voltage, and an output active region to an output signal, the gate located between the reference active region and the output active region on a semiconductor substrate to electrically connect the reference active region to the output active region based on a gate voltage, the reference active region and the output active region being within the semiconductor substrate;
a photo diode under the gate within the semiconductor substrate; and
a reset drain region within the semiconductor substrate to be electrically connected to the photo diode by the gate based on the gate voltage.

14. The image pixel array as claimed in claim 13, wherein:
two unit pixels of the plurality of unit pixels are in respective adjacent rows and share the reset drain region, the two unit pixels being symmetrically placed based on a boundary line extending in a row direction, the two unit pixels sharing the reference active region.

15. The image pixel array as claimed in claim 13, wherein:
the gate is on the semiconductor substrate to cover the output active region,
the gate has a ring shape or a square shape, and
the reset drain region and the reference active region are shared by the plurality of the unit pixels.

16. The image pixel array as claimed in claim 13, wherein a channel between the reference active region and the output active region is a recess channel.

17. A pixel, comprising:
a sensing transistor including a gate, a reference active region, and an output active region, the gate to form a channel between the reference active region and the output active region based on a gate voltage;
a photo diode under the channel; and
a reset drain region electrically connected to the photo diode, wherein the reference active region, the output active region, and the gate are within a substrate.

18. The pixel as claimed in claim 17, wherein the reset drain region is electrically connected to the photo diode by the gate based on the gate voltage.

19. The pixel as claimed in claim 17, wherein the reference active region, the output active region, and the reset drain region are substantially coplanar.

* * * * *